(12) United States Patent
Hsu et al.

(10) Patent No.: US 12,745,454 B2
(45) Date of Patent: Sep. 22, 2026

(54) SINGLE METAL GATE WITH DUAL EFFECTIVE WORK FUNCTION GATE METAL SCHEME

(71) Applicant: Taiwan Semiconductor Manufacturing Co., Ltd., Hsinchu (TW)

(72) Inventors: Chung-Wei Hsu, Hsinchu (TW); Lung-Kun Chu, Hsinchu (TW); Jia-Ni Yu, Hsinchu (TW); Chun-Fu Lu, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 520 days.

(21) Appl. No.: 18/354,515

(22) Filed: Jul. 18, 2023

(65) Prior Publication Data

US 2024/0312993 A1 Sep. 19, 2024

Related U.S. Application Data

(60) Provisional application No. 63/490,993, filed on Mar. 17, 2023.

(51) Int. Cl.
*H01L 27/092* (2006.01)
*H01L 21/8238* (2006.01)
(Continued)

(52) U.S. Cl.
CPC ........... *H10D 84/85* (2025.01); *H10D 30/014* (2025.01); *H10D 30/43* (2025.01); *H10D 30/6735* (2025.01); *H10D 30/6757* (2025.01); *H10D 62/121* (2025.01); *H10D 84/0167* (2025.01); *H10D 84/038* (2025.01)

(58) Field of Classification Search
CPC ...... H10D 84/85; H10D 30/014; H10D 30/43; H10D 30/6735; H10D 30/6757; H10D 62/121; H10D 84/0167; H10D 84/038; H10D 64/685; H10D 84/014;
(Continued)

(56) References Cited

U.S. PATENT DOCUMENTS

2020/0126797 A1* 4/2020 Wang .................. H01L 21/3086
2021/0265496 A1* 8/2021 Chu ..................... H10D 84/038
(Continued)

FOREIGN PATENT DOCUMENTS

KR 1020200047295 A 5/2020
KR 20210029641 A 3/2021
(Continued)

*Primary Examiner* — Tong-Ho Kim
(74) *Attorney, Agent, or Firm* — Seed IP Law Group

(57) ABSTRACT

An integrated circuit includes an NMOS gate all around (GAA) transistor and a PMOS GAA transistor. A single gate metal is utilized for both transistors. An effective work function is imparted to the NMOS transistor by including a first layer of the gate metal around the channels, a semiconductor layer around the first layer of the gate metal, and a gate fill layer of the gate metal on the semiconductor layer. In the PMOS transistor, the gate fill layer of the gate metal is on the gate dielectric without an intervening semiconductor layer.

20 Claims, 26 Drawing Sheets

(51) Int. Cl.

| | |
|---|---|
| ***H01L 29/06*** | (2006.01) |
| ***H01L 29/423*** | (2006.01) |
| ***H01L 29/66*** | (2006.01) |
| ***H01L 29/775*** | (2006.01) |
| ***H01L 29/786*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 84/01*** | (2025.01) |
| ***H10D 84/03*** | (2025.01) |
| ***H10D 84/85*** | (2025.01) |

(58) Field of Classification Search

CPC ........... H10D 84/0144; H10D 84/0177; H10D 84/83; H10D 84/0181; H10D 84/856

USPC .......................................................... 257/288

See application file for complete search history.

(56) References Cited

U.S. PATENT DOCUMENTS

| | | | | |
|---|---|---|---|---|
| 2021/0336033 | A1* | 10/2021 | Huang | H10D 84/0177 |
| 2022/0084830 | A1* | 3/2022 | Hsu | H01L 21/02603 |

FOREIGN PATENT DOCUMENTS

| | | | |
|---|---|---|---|
| KR | 102272133 | B1 | 7/2021 |
| KR | 10-2021-0148804 | A | 12/2021 |
| KR | 10-2022-0058383 | A | 5/2022 |
| TW | I464786 | B | 12/2014 |
| TW | I780849 | B | 10/2022 |
| TW | 202305881 | A | 2/2023 |

* cited by examiner

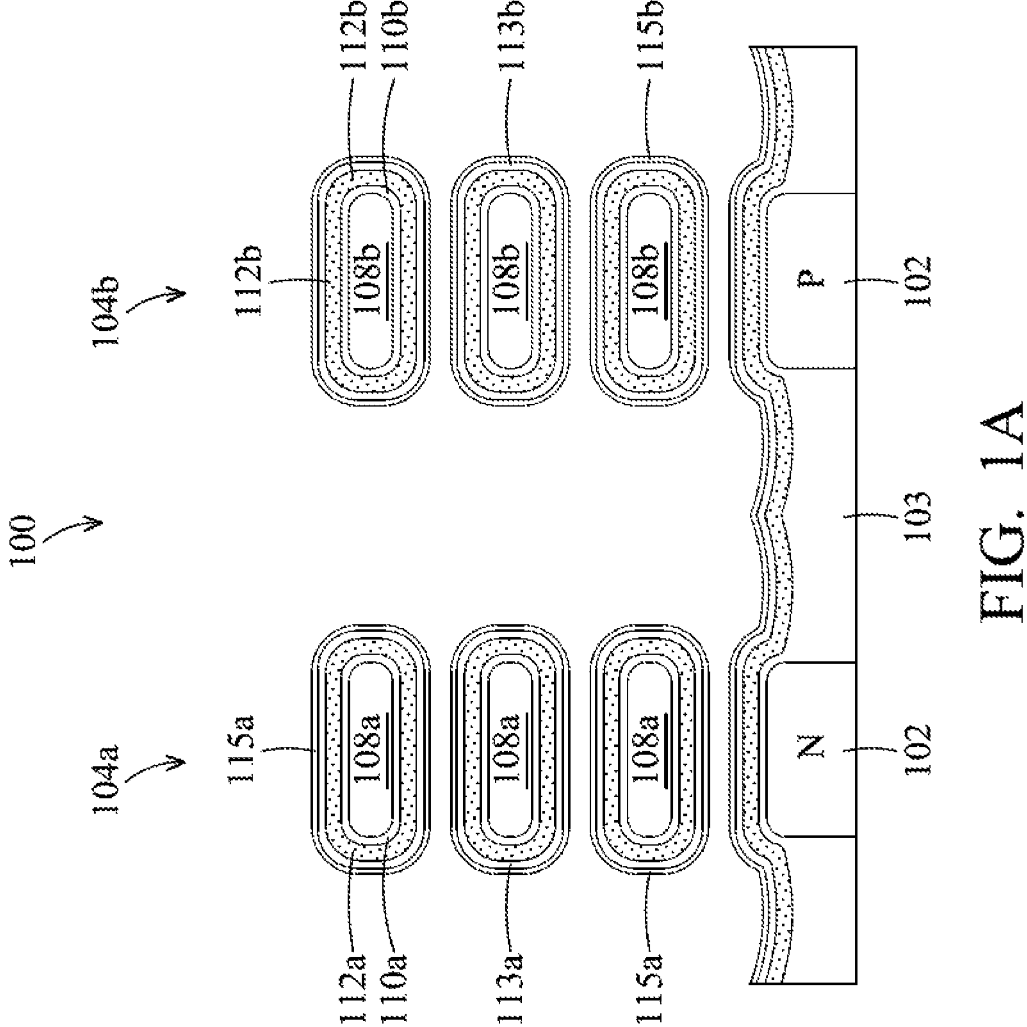
FIG. 1A
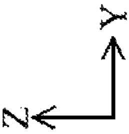

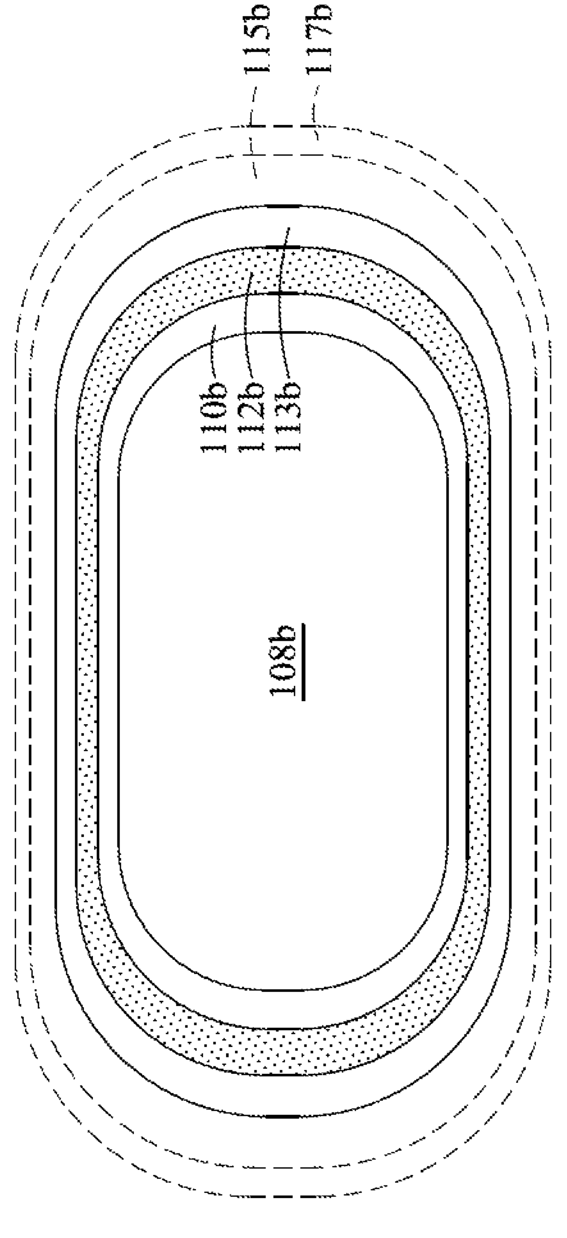
FIG. 1H
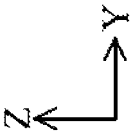

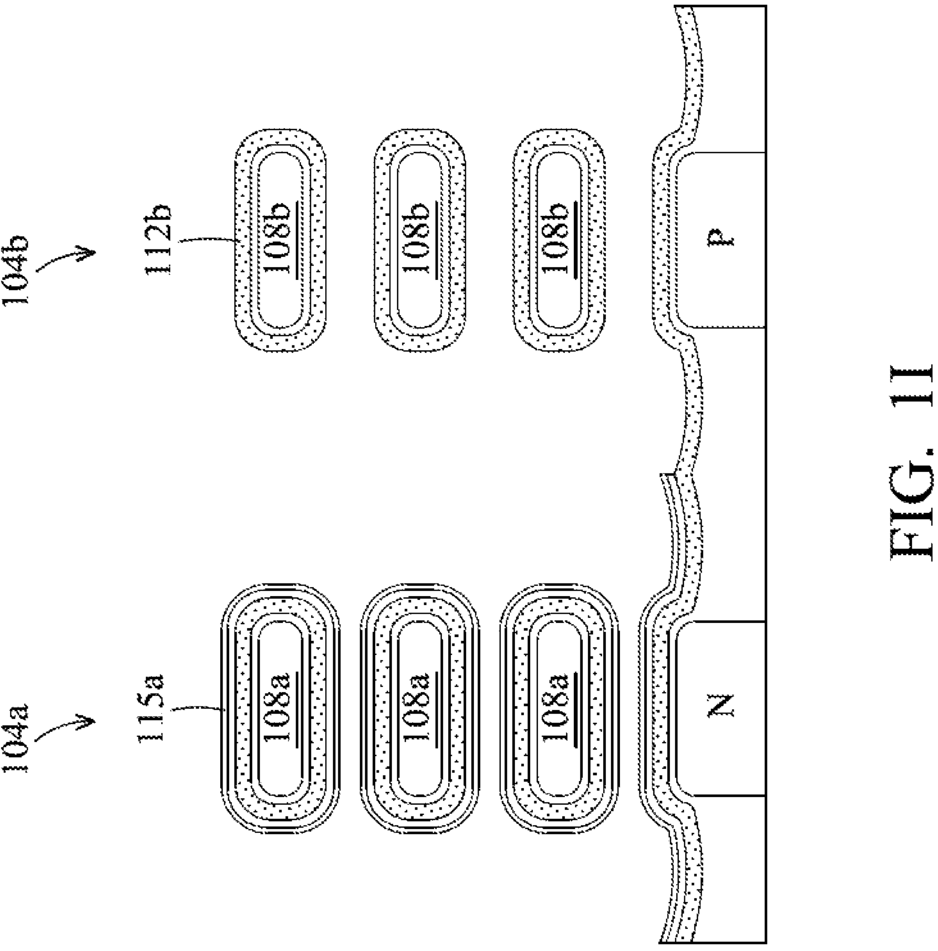
FIG. 1I
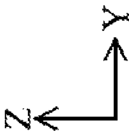

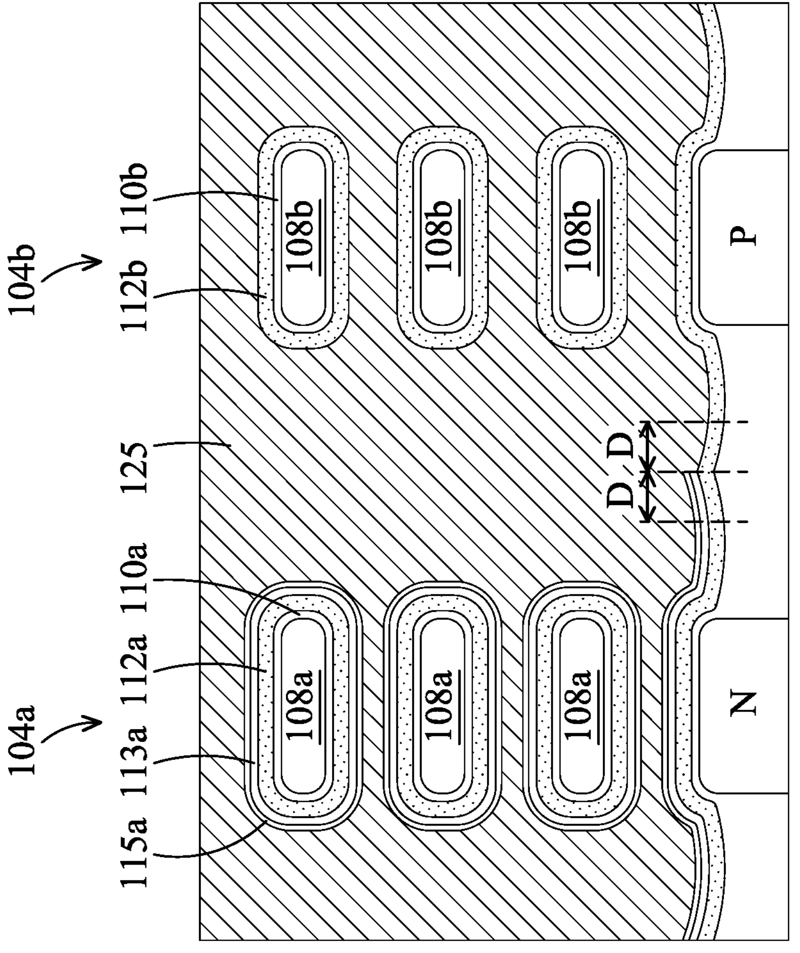
FIG. 1K
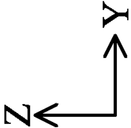

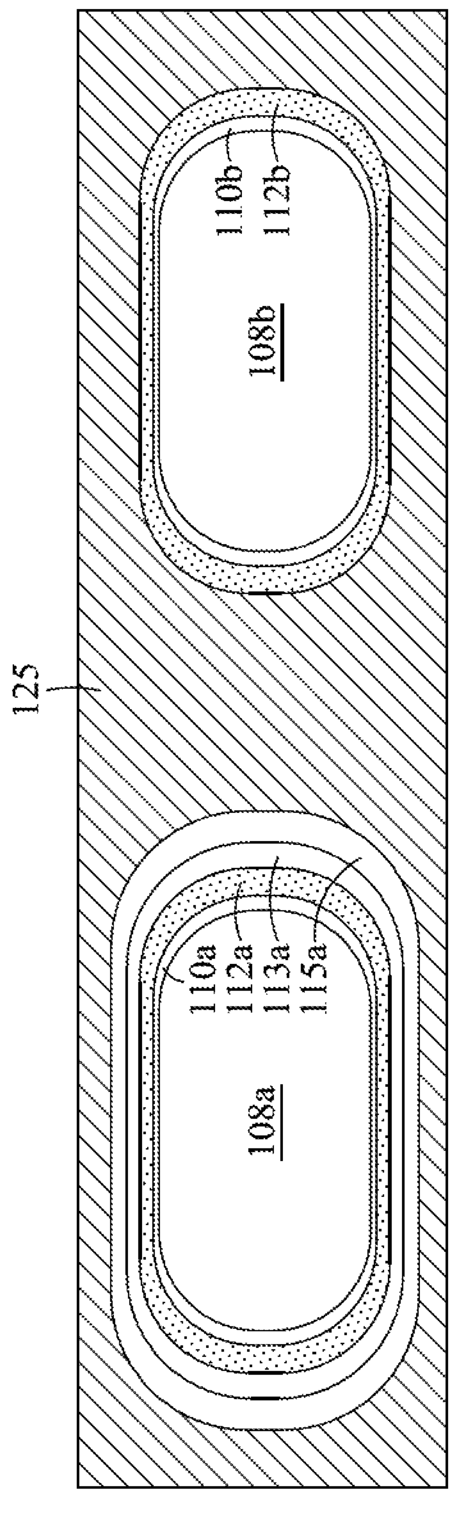
FIG. 1L
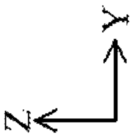

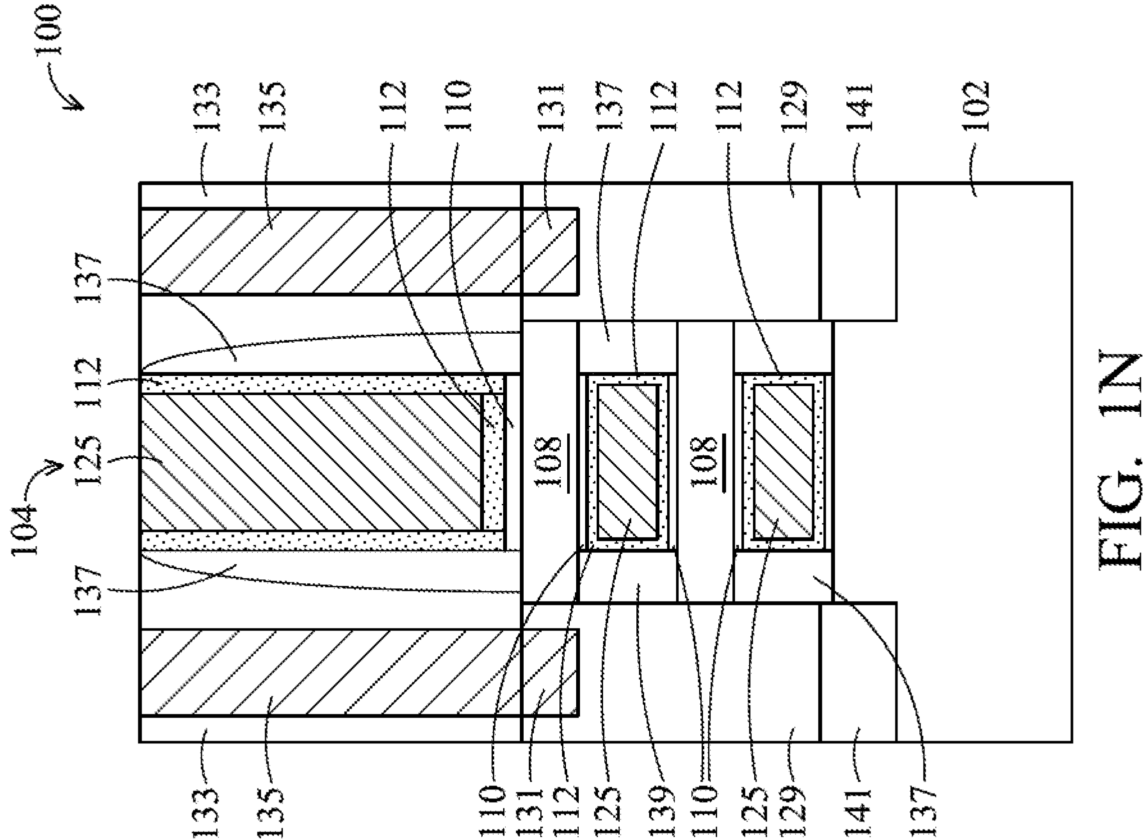
100
104
133
135
112
110
131
137
129
141
102
125
108
139
FIG. 1N
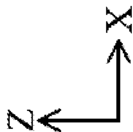
X
Z

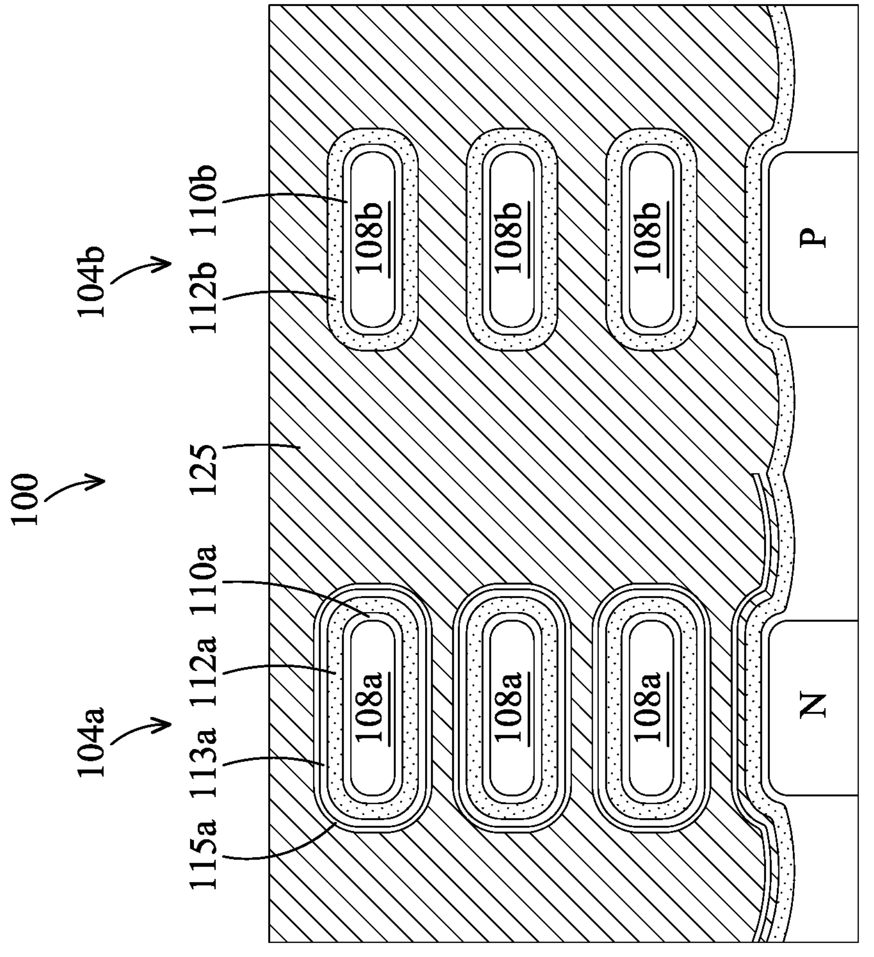
FIG. 2G
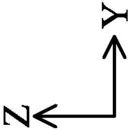

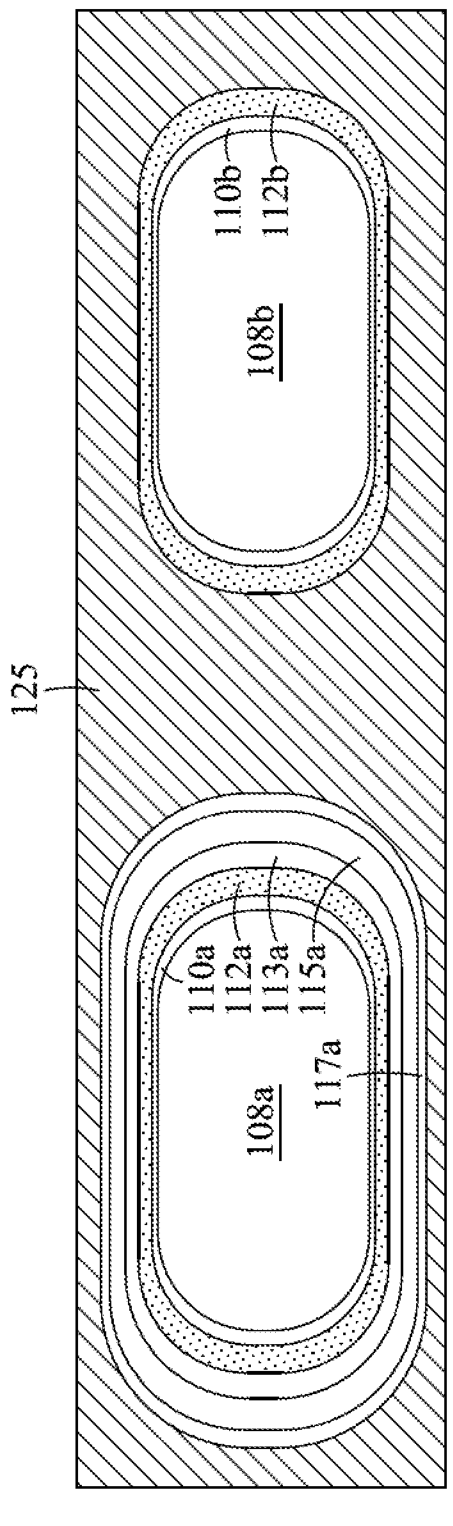
FIG. 2H
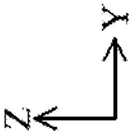

125
110b
112b
113b
115b
108b
108a
110a
112a
113a
115a 125
110b
112b
113b
115b
108b
108a
110a
112a
113a
115a 125
110b
112b
108b
108a
110a
112a
113a
115a

Y
Z

SINGLE METAL GATE WITH DUAL EFFECTIVE WORK FUNCTION GATE METAL SCHEME

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to include transistors that have different threshold voltages.

The formation of gate electrodes may include the deposition of various conductive layers. However, for 3D transistors such as FinFET transistors and gate all around (GAA) transistors, it may be difficult to deposit and selectively remove various conductive layers for different types of transistors. The result of this is that the threshold voltages of the various device regions may not be in accordance with design specifications. This can lead to nonfunctioning transistors, poor wafer yields, and electronic devices that do not function properly. The threshold voltage of the resulting device regions may not be accurate as designed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I are cross-sectional diagrams of an integrated circuit at various stages of processing, in accordance with some embodiments.

DETAILED DESCRIPTION

Figure 1B:
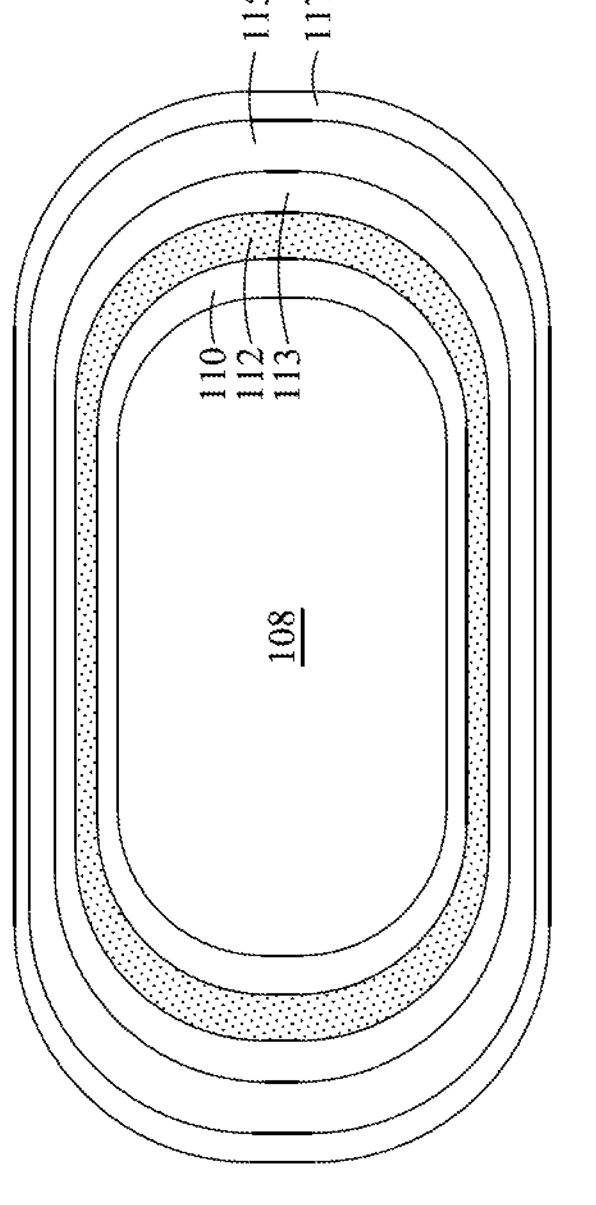
FIGS. 1A-1N are cross-sectional diagrams of an integrated circuit at various stages of processing, in accordance with some embodiments.
Figure 1B:
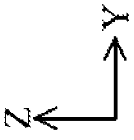

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with simplified gate electrode structures for both NMOS and PMOS transistors. In particular, a single gate metal may be used for both NMOS and PMOS transistors. An effective work function layer can be formed for NMOS transistors by depositing a thin layer of the gate metal followed by deposition of a semiconductor material, such as silicon or other suitable materials. The semiconductor layer is removed at the PMOS transistors. The gate metal is then deposited on both the NMOS and the PMOS regions. The semiconductor layer combined with the initial thin deposition of the gate metal results in an effective work function for the NMOS transistors. At the PMOS transistors, the gate electrode may include a single gate metal in contact with the gate dielectric layers. The result is that the gate resistance of the NMOS transistors is improved by utilizing the semiconductor plus thin gate metal as a work function layer. Furthermore, the transistor can be scaled down and the cell height can be reduced due to the single gate metal utilized for both the NMOS and PMOS transistors. The physical gate metal boundary is the same as the actual gate metal boundary due to the lack of diffusion. This leads to properly functioning integrated circuits, higher wafer yields, and better functioning electronic devices.

FIG. 1A is a cross-sectional view of an integrated circuit 100 at an intermediate stage of processing, in accordance with some embodiments. In FIG. 1A, NMOS transistors 104*a* and PMOS transistors 104*b* are at an intermediate stage of processing. As will be set forth in more detail below, the process for forming the integrated circuit 100 results in transistors 104*a* and 104*b* having different threshold voltages.

FIG. 1A a illustrates a single NMOS transistor 104*a* and a single PMOS transistor 104*b*. However, in practice, the integrated circuit 100 will include a large number of NMOS transistors 104*a* and PMOS transistors 104*b*. As shown in the figures and described herein, various reference numbers may include the suffix "a". Reference numbers with the suffix "a" typically will be referred to materials or structures, or the portions of materials or structures that particularly are associated with the NMOS transistor 104*a*. As shown in the figures and described herein, various reference numbers may include the suffix "b". Reference numbers with the suffix "b" typically will refer to materials or structures, or portions of materials or structures that are particularly associated with the PMOS transistor 104*b*. The following description may in some cases refer to reference numbers without the suffix "a" or "b" when the aspect of the material or the structure being described is not particular either the NMOS transistor 104*a* or the PMOS transistor 104*b*.

Figures herein may include reference axes X, Y, and Z. In FIG. 1A, the axis Y corresponds to the horizontal direction. The axis Z corresponds to the vertical direction. The X axis will correspond to the direction into and out of the drawing sheet.

The transistors 104*a* and 104*b* may correspond to gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around transistors may each include a plurality of semiconductor nanostructures corresponding to channel regions of the transistors. The semiconductor nanostructures may include nanosheets, nanowires, or other types of nanostructures. The gate all around transistors may also be termed nanostructure transistors.

The transistors 104*a* and 104*b* are formed in the same integrated circuit 100, though they may be located at different regions of the integrated circuit 100. The transistors 104*a* and 104*b* may be adjacent to each other as shown in FIG. 1A or may be in different regions of the integrated circuit 100.

The integrated circuit 100 includes a semiconductor substrate 102. In one embodiment, the semiconductor substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 may include one or more insulating features, such as shallow trench isolations 103 separating the transistors 104*a* from the transistors 104*b*, or separating the transistors 104*a* from each other and the transistors 104*b* from each other. The shallow trench isolation 103 can be utilized to separate groups of transistor structures formed in conjunction with the semiconductor substrate 102. The shallow trench isolation 103 can include a dielectric material. The dielectric material for the shallow trench isolation may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation 103 without departing from the scope of the present disclosure.

The transistors 104*a* and 104*b* each include a plurality of channel regions 108*a*/108*b*. The channel regions 108*a* corresponds to the channel region of the transistor 104*a*. The channel regions 108*b* correspond to channel regions of the transistor 104*b*. Though not shown in FIG. 1A, upon completion of the transistors 104*a* and 104*b*, each of the channel regions 108*a*/108*b* of the transistors 104*a* and 104*b* will extend between source/drain regions of the transistors 104*a* and 104*b*. In FIG. 1A, the transistors 104*a* and 104*b* each include three vertically stacked channel regions 108*a*/108*b*. However, in practice, the transistors 104*a* and 104*b* may each include more than two vertically stacked channel regions 108*a*/108*b*. The channel regions 108*a*/108*b* may correspond to semiconductor nanostructures. The semiconductor nanostructures can include semiconductor nanosheets, semiconductor nanowires, or other types of semiconductor nanostructures.

The channel regions 108*a*/108*b* are formed over the substrate 102. The channel regions 108*a*/108*b* may include one or more layers of Si, Ge, SiGe, GaAs, InSb, GaP, GaSb, InAlAs, InGaAs, GaSbP, GaAsSb or InP. In one embodiment, the channel regions 108*a*/108*b* are the same semiconductor material as the substrate 102. Other semiconductor materials can be utilized for the channel regions 108*a*/108*b* without departing from the scope of the present disclosure.

The width of the channel regions 108*a*/108*b* in the Y direction is between 14 nm and 60 nm. The length of the channel regions in the X direction (i.e., the distance between source/drain regions of a transistor 104) can be between 8 nm and 15 nm. The thickness of the channel regions 108*a*/108*b* in the Z direction can be between 4 nm and 8 nm. The distance between the channel regions 108*a*/108*b* in the Z direction can be between 5.5 nm and 15 nm. Other dimensions can be utilized for the channel regions 108*a*/108*b* without departing from the scope of the present disclosure.

In FIG. 1A, each semiconductor nanosheet 108*a*/108*b* of the transistors 104*a* and 104*b* is covered by an interfacial dielectric layer 110*a*/110*b*. The interfacial dielectric layer 110*a*/110*b* may be used in order to create a good interface between the channel regions 108*a*/108*b* and subsequent dielectric layers, as will be described in further detail below. The interfacial dielectric layer 110*a*/110*b* can assist in suppressing the mobility degradation of charge carries in the channel regions 108*a*/108*b* that serve as channel regions of the transistors 104*a* and 104*b*. At the stage of processing shown in FIG. 1A, the interfacial dielectric layer 110*a* and the interfacial dielectric layer 110*b* may have a same thickness. For example, the thickness of the interfacial dielectric layers 110*a/b* in FIG. 1A may be between 10 Å and 17 Å. However, when processing is complete, as will be described in more detail below, the thickness of the interfacial dielectric layer 110*a* may be reduced relative to the thickness of the interfacial dielectric layer 110*b*. The final thickness of the interfacial dielectric layer 110*a* may be between 8 Å and 15 Å. Other dimensions can be utilized for the interfacial dielectric layers 110*a*/110*b* without departing from the scope of the present disclosure.

The interfacial dielectric layer 110*a*/110*b* can include a dielectric material such as silicon oxide, silicon nitride, or other suitable dielectric materials. The interfacial dielectric layer 110*a*/110*b* can include a comparatively low-K dielectric with respect to high-K dielectric materials such as hafnium oxide or other high-K dielectric materials that may be used in gate dielectrics of transistors. High-K dielectrics can include dielectric materials with a dielectric constant higher than the dielectric constant of silicon oxide. In the example of FIG. 1A, the interfacial dielectric layer 110*a*/110*b* is silicon dioxide, though other materials can be utilized without departing from the scope of the present disclosure.

The interfacial dielectric layer 110*a*/110*b* can be formed by a thermal oxidation process, a chemical vapor deposition (CVD) process, or an atomic layer deposition (ALD) process. One consideration in selecting a thickness for the interfacial dielectric layer 110*a*/110*b* is to leave sufficient space to deposit and etch various materials between the channel regions 108*a*/108*b*, as will be explained in more detail below. Other materials, deposition processes, and thicknesses can be utilized for the interfacial dielectric layer 110*a*/110*b* without departing from the scope of the present disclosure.

The transistors 104*a* and 104*b* each include a high-K gate dielectric layer 112*a*/112*b*. The high-K gate dielectric layer 112*a*/112*b* is positioned on the interfacial dielectric layer 110*a*/110*b* around each of the channel regions 108*a*/108*b*. The interfacial dielectric layer 110*a*/110*b* separates the high-K gate dielectric layer 112*a*/112*b* from the channel regions 108*a*/108*b*. The high-K gate dielectric layer 112*a*/112*b* and the interfacial dielectric layer 110*a*/110*b* collectively form a gate dielectric of the transistors 104*a* and 104*b*. The high-K gate dielectric layer 112*a*/112*b* and the interfacial dielectric layer 110*a*/110*b* physically separate the channel regions 108*a*/108*b* from the gate metals that will be deposited in subsequent steps. The high-K gate dielectric layer 112*a*/112*b* and the interfacial dielectric layer 110*a*/110*b* isolate the gate metals from the channel regions 108*a*/108*b* that correspond to the channel regions of the transistors.

The high-K gate dielectric layer 112*a*/112*b* includes one or more layers of a dielectric material, such as $HfO_2$, HfSiO, HfSiON, HfTaO, HfTIO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer 112*a*/112*b* may be formed by CVD, ALD, or any suitable method. In one embodiment, the high-K gate dielectric layer 112*a*/112*b* is formed using a highly conformal deposition process such as ALD in order to ensure the formation of a gate dielectric layer having a uniform thickness around each channel region 108. In one embodiment, the thickness of the high-k dielectric is in a range from about 1 nm to about 2 nm. Other thicknesses, deposition processes, and materials can be utilized for the high-K gate dielectric layer 112*a*/112*b* without departing from the scope of the present disclosure.

The transistors 104*a* and 104*b* each include a gate metal 113*a*/113*b* on the high-K gate dielectric layer 112*a*/112*b*. In FIG. 1A, the gate metal 113*a*/113*b* surrounds each of the channel regions 108*a*/108*b*. The layer 113*a*/113*b* of the gate metal is a conductive material having a thickness between 2 Å and 10 Å. The layer 113*a*/113*b* of the gate metal can include TiN, W, WCN, Ru, Mo, or other suitable conductive materials. The layer 113*a*/113*b* of the gate metal can be deposited by PVD, ALD, CVD, or other suitable deposition processes. As will be set forth in more detail below, the layer 113*a*/113*b* of the gate metal is a same material as a subsequent gate metal layer or gate fill material that will be deposited at both the transistor 104*a* and the transistor 104*b*. Other materials, thicknesses, and deposition processes can be utilized for the layer 113*a*/113*b* of the gate metal without departing from the scope of the present disclosure.

The transistors 104*a* and 104*b* each include a semiconductor layer 115*a*/115*b* positioned on the layer 113*a*/113*b* of the gate metal. The semiconductor layer 115*a*/115*b* surrounds each of the channel regions 108*a*/108*b*. The semiconductor layer 115*a*/115*b* can include silicon, silicon germanium, or other suitable semiconductor materials. In the example shown herein the semiconductor layer 115*a*/115*b* is silicon. As will be set forth in more detail below, the position of the semiconductor layer 115*a*/115*b* can adjust the effective work function of the transistors 104*a* and 104*b*. The semiconductor layer 115*a*/115*b* can be deposited by ALD, CVD, PVD, or other suitable deposition processes. The thickness of the semiconductor layer 115*a*/115*b* may be between 1 Å and 5 Å. In some embodiments, the total thickness of the layer 113*a*/113*b* of the gate metal and the semiconductor layer 115*a*/115*b* is between 3 Å and 15 Å. One example, the total thickness is between 3 Å and 8 Å. Other materials, deposition processes, and dimensions can be utilized for the semiconductor layer 115*a*/115*b* without departing from the scope of the present disclosure.

In some embodiments, there may be intermixing between the layer 113*a*/113*b* of the gate metal and the semiconductor layer 115*a*/115*b*. In an example in which the layer 113*a*/113*b* of the gate metal is titanium nitride and the semiconductor layer 115*a*/115*b* is silicon, the thin layer of SiTiN may form.

In some embodiments, there is an intermixing layer of SiTiN at the N-channel transistor 104*a*, but not at the P-channel transistor 104*b*.

FIG. 1B is an enlarged view of a channel region 108 of FIG. 1A, in accordance with some embodiments. Because at the stage of processing of FIG. 1A there is not yet a difference in the material surrounding the channel regions 108*a*/108*b*, no suffixes are given for the layers in FIG. 1B. The enlarged view of FIG. 1B illustrates an oxide layer 117 on the semiconductor layer 115. The oxide layer may correspond to a native oxide layer that grows on the semiconductor layer 115. In an example in which the semiconductor layer 115 is silicon, the oxide layer 117 may be silicon oxide and may have a thickness between 1 Å and 5 Å. Other materials and dimensions can be utilized for the oxide layer 117 without departing from the scope of the present disclosure.

Figure 1C:
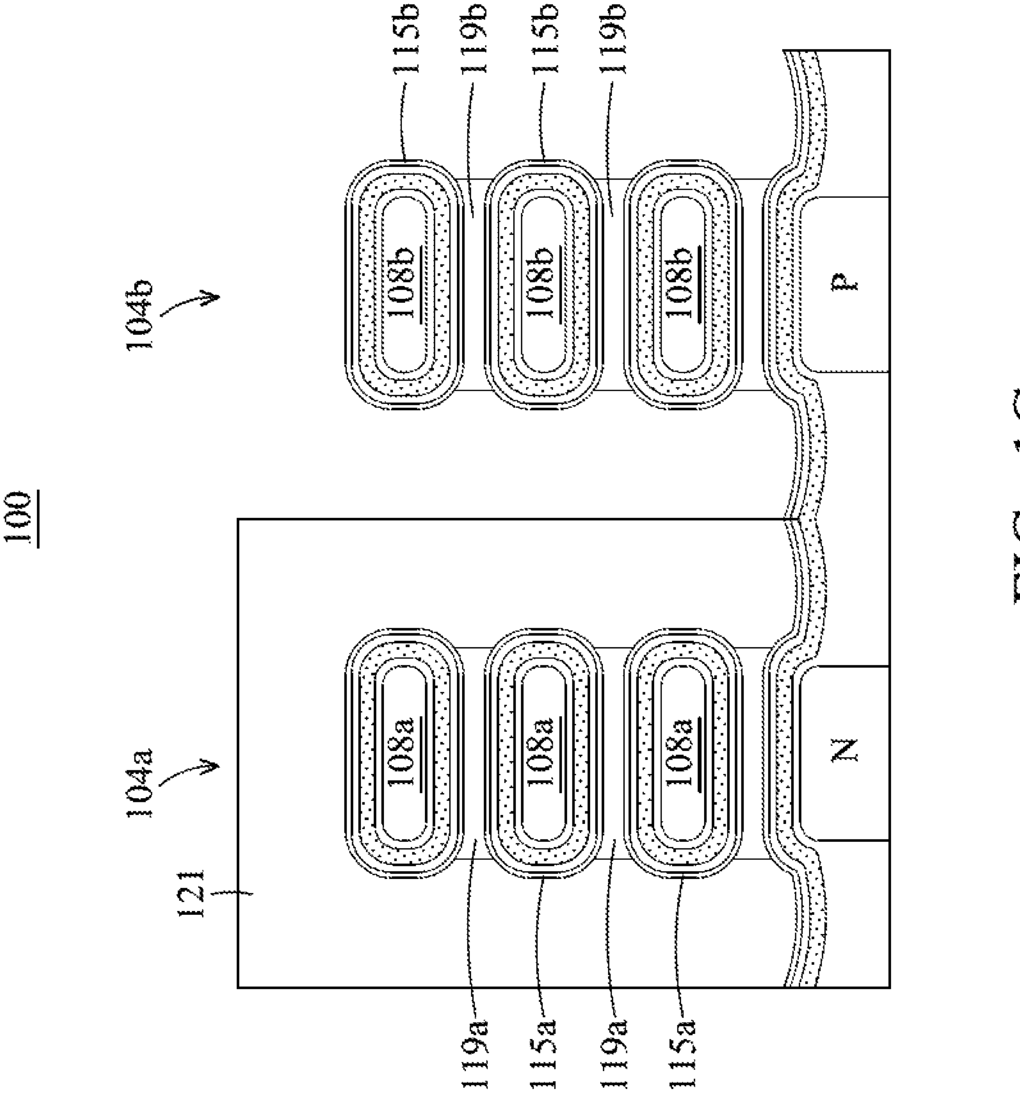

In FIG. 1C, dielectric plugs 119*a*/119*b* have been formed between the channels 108*a*/108*b*. In particular, the dielectric plugs 119*a*/119*b* are in contact with the semiconductor layer 115*a*/115*b* between adjacent channels 108*a*/108*b*. The plugs 119*a*/119*b* may substantially fill the gaps between adjacent channels 108*a*/108*b*. In one example, the dielectric plugs 119*a*/119*b* can include one or more of AlOx (where x represents the concentration of oxygen), ZrO2, SiN, or other suitable materials.

The dielectric plugs 119*a*/119*b* may be formed by initially conformally depositing a dielectric material on all exposed surfaces of the semiconductor layer 115*a*/115*b*. The deposition can be accomplished by ALD, CVD, PVD, or other suitable deposition processes. After deposition of the dielectric material, an etchback process may be performed to remove the dielectric material from all locations except directly between the channels 108*a*/108*b*. The etching process can include a timed etch, a wet etch, dry etch, or other types of etching processes. The result is that the dielectric plugs 119*a*/119*b* shown in FIG. 1C.

In FIG. 1C a layer of photoresist 121 has been deposited. The photoresist layer 121 can include multiple layers of photoresist including a bottom layer and the top layer. The layer of photoresist 121 can be deposited by standard photoresist deposition techniques including vapor deposition, spread deposition, spin-on coating, or by other suitable process.

In FIG. 1C, the photoresist layer 121 has been patterned. The layer of photoresist 121 is patterned to expose the structures of the transistor 104*b*. The structures of the transistor 104*a* are covered by the layer of photoresist 121. The layer of photoresist 121 can be patterned by exposing the layer of photoresist 121 to light via a photolithography mask. Accordingly, the layer of photoresist 121 can be deposited and patterned using standard photolithography techniques.

Figures 1D, 1E:
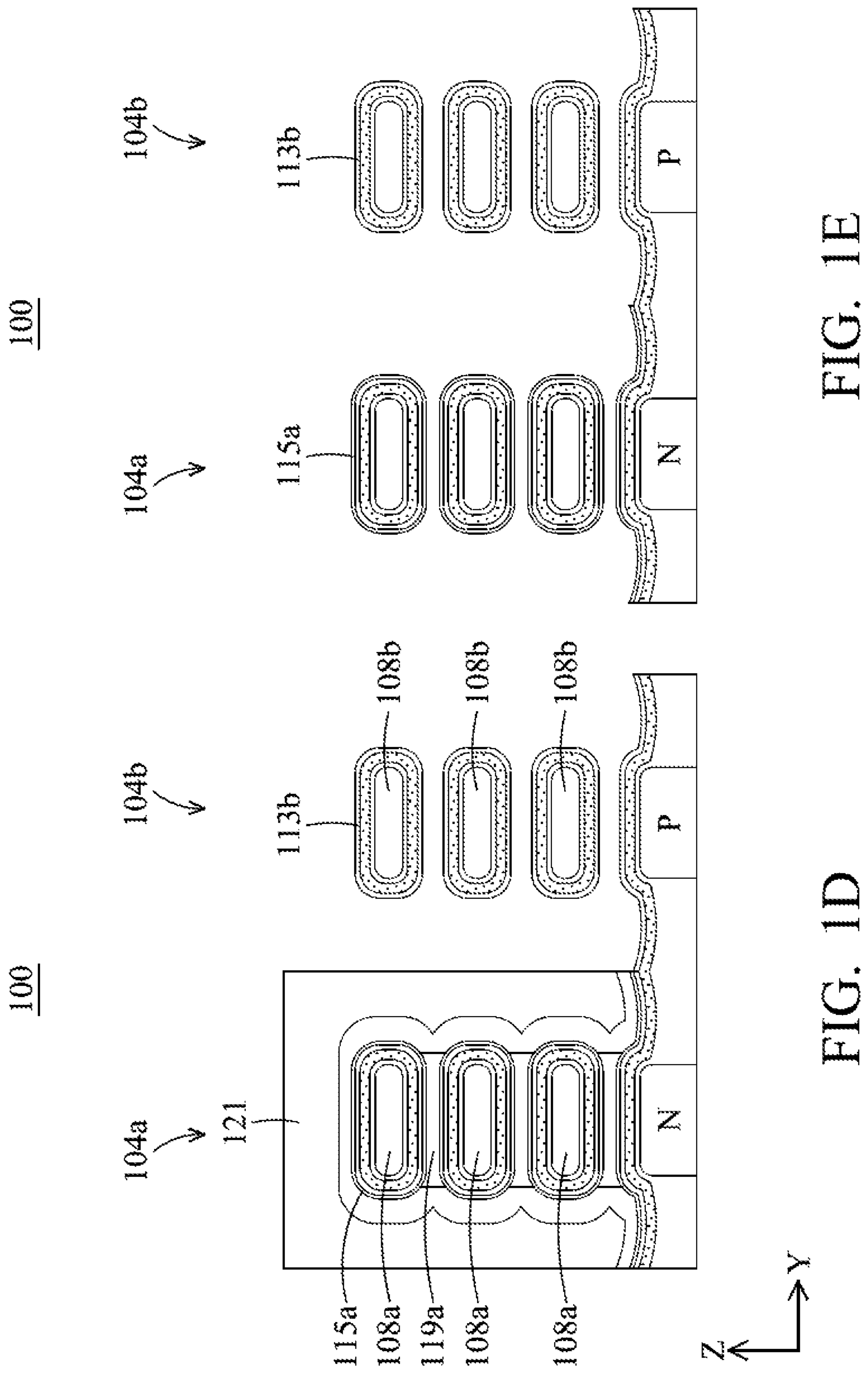

In FIG. 1D, an etching process has been performed on the integrated circuit 100. In particular, the etching process has been performed on the portion of the integrated circuit 100 that is not covered by the photoresist 121. The etching process etches the dielectric plugs 119*b* from the transistor 104*b*. The etching process also removes the semiconductor layer 115*b*. In practice, a separate etching process may be utilized for removing the semiconductor layer 115*b* after removing the dielectric plugs 119*b*. The result is that the layer 113*b* of the gate metal is exposed. The etching process can include a wet etch, a dry etch, an atomic layer etching (ALE) process, a timed etch, or other suitable etching techniques. Because the transistor 104*a* is still covered in the photoresist 121, the etching process does not remove the dielectric plugs 119*a* at the region of the transistor 104*a*.

In FIG. 1E, the photoresist layer 121 has been removed. The photoresist layer 121 can be removed by an ashing process. The ashing process completely removes the photoresist layer 121. An etching process has also been performed to remove the dielectric plugs 119*a*. The etching process can include a wet etch, a dry etch, a timed etch, or other types of etching processes. Other suitable methods may be utilized for removing the photoresist and the dielectric plugs 119*a* without departing from the scope of the present disclosure.

In FIG. 1E, an annealing process has been performed. The annealing process can include raising a temperature of the integrated circuit to between 700 °C and 900 °C. This annealing process can repair defects in the high-K gate dielectric layer 112*a*/112*b*. The annealing process may be referred to as a post-metal annealing process.

Figures 1F, 1G:
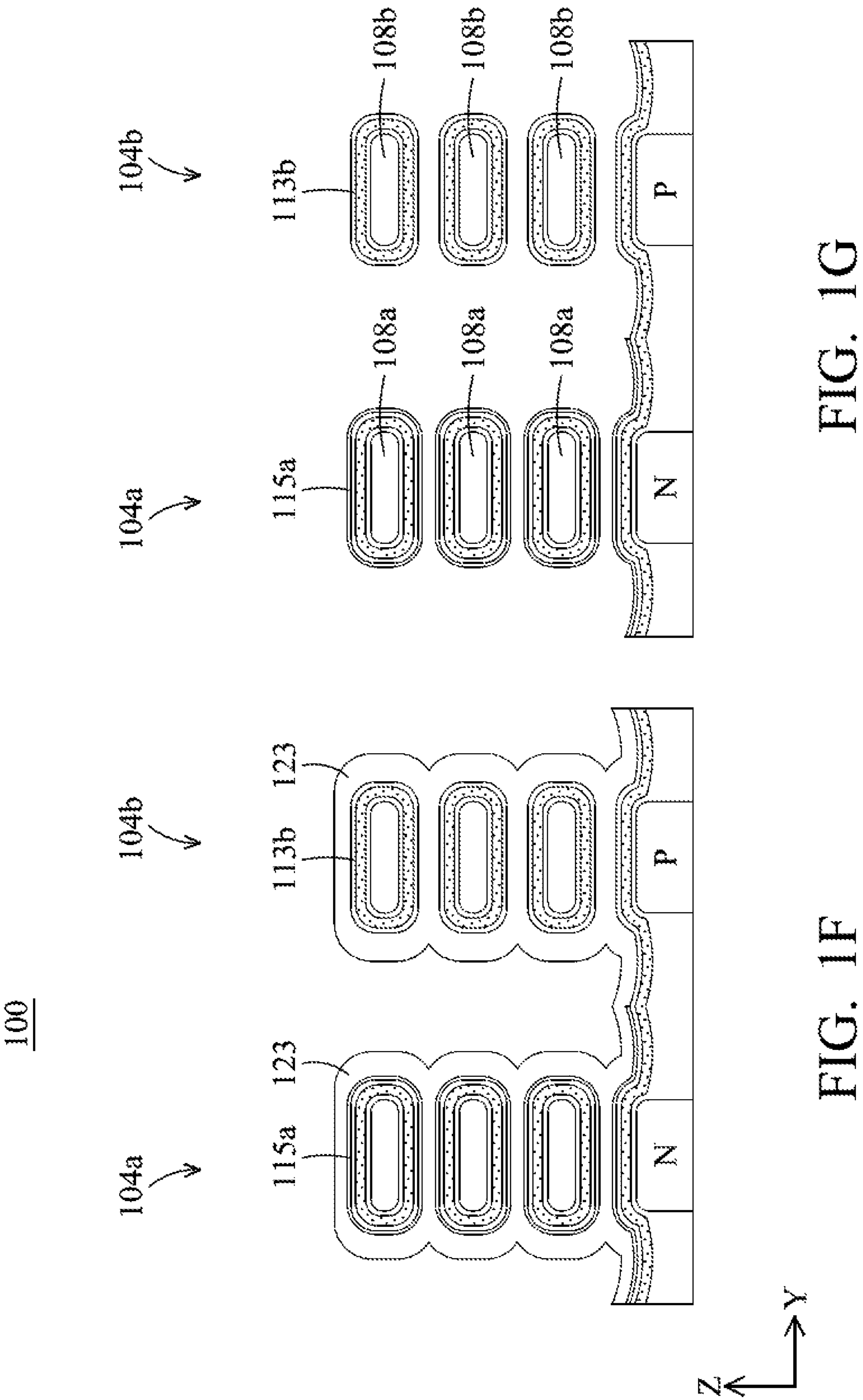

In FIG. 1F, a dipole semiconductor cap layer 123 has been deposited at the areas of both the transistor 104*a* and the transistor 104*b*. The semiconductor cap layer 123 is deposited directly on the semiconductor layer 115*a* at the transistor 104*a*. The semiconductor cap layer 123 is deposited directly on the layer 113*b* of the gate metal of the transistor 104*b*. The semiconductor cap layer 123 can include a dielectric material such as silicon nitride, silicon oxide, silicon carbide, or other suitable dielectric materials. Alternatively, the semiconductor cap layer 123 can include a semiconductor material such as silicon, silicon germanium, or other suitable semiconductor materials. After deposition of the semiconductor cap layer 123, a thermal annealing process may be performed. The thermal annealing process can be performed by raising the temperature of the integrated circuit 100 to between 800 °C and 950 °C. The thermal annealing process can further repair defects in the high-K gate dielectric layer 112*a*/112*b*. The repair may result from reformation of a crystal structure after previous damage, by migration of material to damaged areas, or from other mechanisms. The high temperatures of the thermal annealing process may enable such repairing.

In FIG. 1G, the semiconductor cap layer 123 has been removed. The semiconductor cap layer can be removed by an etching process. The etching process can include a wet etch, a dry etch, a timed etch, or other types of etching processes. The result is that the semiconductor layer 115*a* is exposed at the transistor 104*a*. The layer 113*b* of the gate metal is exposed at the transistor 104*b*.

FIG. 1H is an enlarged view of one of the channels 108*b* of the transistor 104*b* at the stage of processing shown in FIG. 1G. The interfacial gate dielectric layer 110*b*, the high-K gate dielectric layer 112*b*, and the layer 113*b* of the gate metal are present. Dashed lines indicate the layers have been removed. In particular, the semiconductor layer 115*b* and the oxide layer 117*b* have been removed from the channels 108*b* of the transistor 104*b*.

In FIG. 1I, an etching process has been performed on the integrated circuit 100, in accordance with some embodiments. The etching process etches the layer 113*b* of the gate metal from the transistor 104*b*. In particular, the etching process removes the layer 113*b* of the gate metal with respect to the material of the semiconductor layer 115*a*. The result is that the high-K gate dielectric layer 112*b* of the transistor 104*b* is exposed. The etching process can include a wet etch, a dry etch, a timed etch, or other suitable etching processes. Although FIG. 1 I illustrates the removal of the layer 113*b* of the gate metal from the transistor 104*b*, in some embodiments the layer 113*b* of the gate metal is not removed. For example, FIG. 1J below illustrates an example in which the layer 113*b* of the gate metal has not been removed.

Figure 1J:
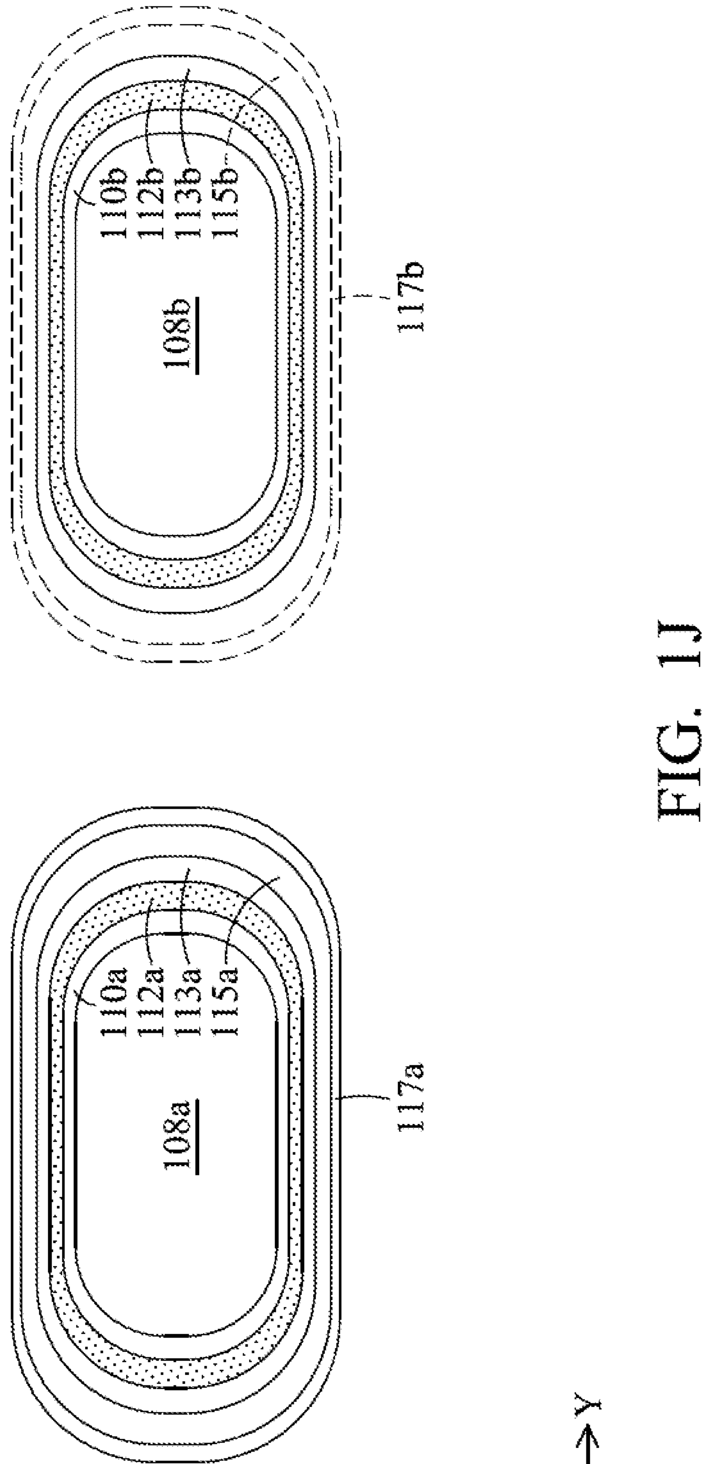

FIG. 1J is an enlarged view of a channel 108*a* of the transistor 104*a* and the channel 108*b* of the transistor 104*b* at the stage of processing shown in relation to FIG. 1G, in accordance with some embodiments. FIG. 1J illustrates the presence of the interfacial dielectric layer 110*a*, the high-K gate dielectric layer 112*a*, the layer 113*a* of the gate metal, the semiconductor layer 115*a*, and the oxide layer 117*a*. The oxide layer 117*a* may be very thin and is not shown in FIG. 1G. The same layers are present on the channel 108*b* as are shown in FIG. 1H.

In FIG. 1K a gate fill layer 125 of the gate metal has been deposited at both the transistor 104*a* and the transistor 104*b*. The gate fill layer 125 is the same gate metal as the layers 113*a* and 113*b* of the gate metal. In some embodiments, the gate fill layer 125 includes TIN, W, WCN, Ru, Mo, or other suitable conductive materials. The gate fill layer 125 can be deposited by PVD, ALD, CVD, or other suitable deposition processes. In some embodiments, the oxide layer 117*a* is removed from the semiconductor layer 115*a* prior to deposition of the gate fill layer 125 of the gate metal.

In some embodiments, the metal gate boundary at the center point between the NMOS transistor 104*a* and the PMOS transistor 104*b* has a dimension D to either side of the center point. The dimension D can be between 0 nm and 5 nm.

In some embodiments, after processing the high-K gate dielectric layers 112*a* and 112*b* have a same thickness based, in part, on the lack of patterning of the gate fill layer 125. In some embodiments, the interfacial gate dielectric layer 110*a* is thinner than the interfacial gate dielectric layer 110*b*.

The integrated circuit 100 shown in relation to FIGS. 1A-1K may have various benefits in relation to other potential circuit structures and processes. For example, one potential circuit structure utilizes aluminum-based metals as work function layers for the NMOS transistor. However, the aluminum is easily oxidized and aluminum oxide is a high resistance. This can result in a high gate resistance as the devices scale-down. Furthermore, aluminum is easy to diffuse, potentially leading to a worse metal gate boundary. Additionally, utilizing multiple different metals from the gate structures can result in difficulties in patterning the gate metals. Accordingly, in some embodiments the integrated circuit 100 uses only a single gate metal. The layer 113*a* of the gate metal and the gate fill layer 125 are the same material. The effective work function of the transistor 104*a* (and, therefore, the threshold voltage of the transistor 104*a*) are adjusted by the presence of the semiconductor layer 115*a* in the transistor 104*a*. The structure of the PMOS transistor 104*b* is very simple with either the gate fill layer 125 or both the gate fill layer and the layer 113*b* of the gate metal being present. The gate resistance may be less than or equal to 200 ohms/sq.

FIG. 1L is an enlarged view of a portion of the integrated circuit 100 at the stage of processing shown in FIG. 1K, in accordance with some embodiments. The enlarged view of FIG. 1L illustrates a single channel 108*a* of the transistor 104*a* and a single channel 108*b* of the transistor 104*b*. The gate fill layer 125 is in contact with the semiconductor layer 115*a* at the transistor 104*a* and with the high-K gate dielectric layer 112*b* at the transistor 104*b*.

Figure 1M:
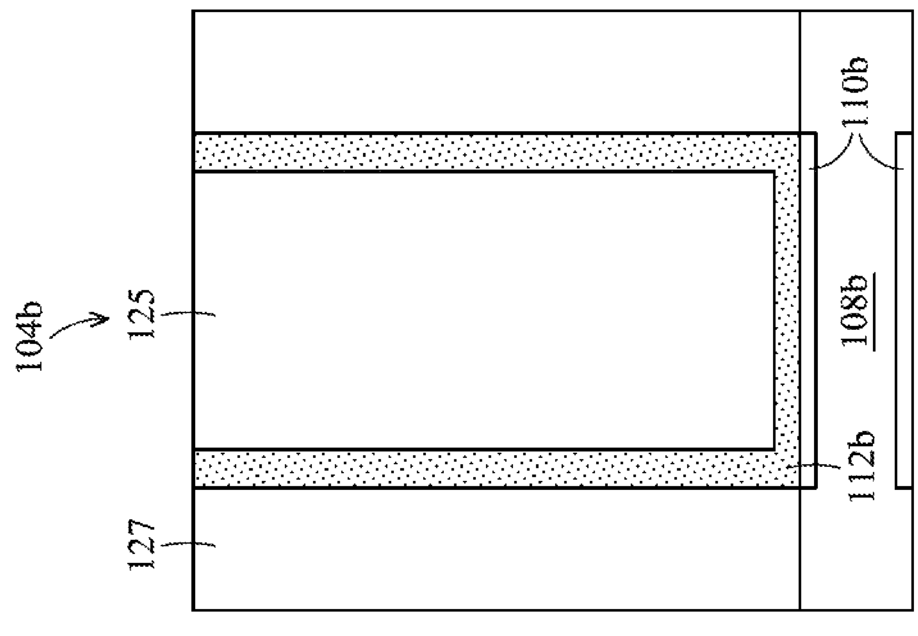
Figure 1M:
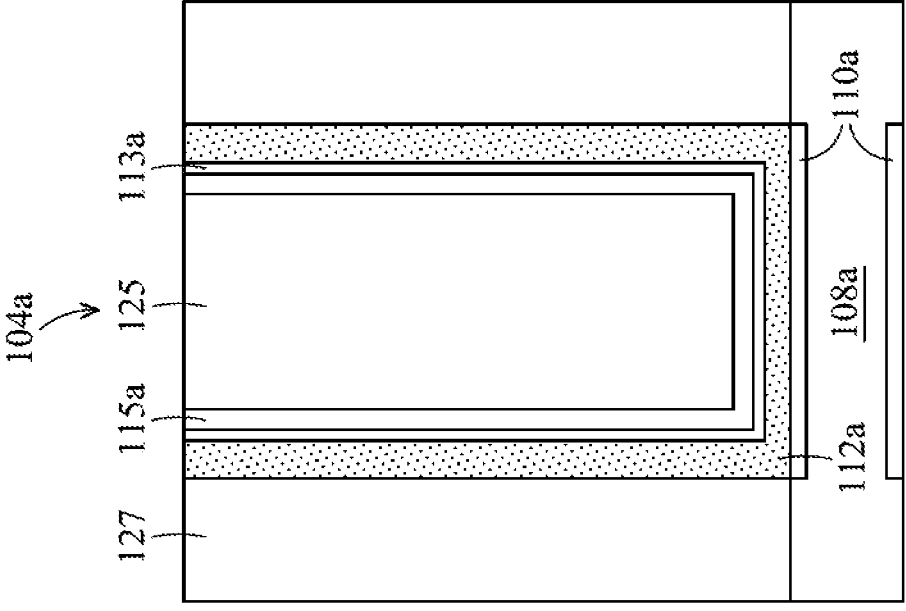

FIG. 1M is a cross-sectional view of a portion of the integrated circuit 100, in accordance with some embodiments. In the view of FIG. 1M, the horizontal direction is the X direction and the vertical direction is the Z direction. FIG. 1M more clearly illustrates the gate structure above the channels 108*a* and 108*b*. In particular, the gate trench above the channels 108*a* includes the high-K gate dielectric layer 112*a*, the layer 113*a* of the gate metal, the semiconductor layer 115*a*, and the gate fill layer 125. The gate trench is bounded by a dielectric layer 127. The gate trench above the channels 108*b* includes the high-K gate dielectric layer 112*b* and the gate fill layer 125. Only a single channel 108*a* and 108*b* is shown for each transistor 104*a* and 104*b*. In practice, the additional stacked channels 108*a*/108*b* are below the channels 108*a* and 108*b* shown in FIG. 1M.

FIG. 1N is a cross-sectional view of the integrated circuit 100, according to one embodiment. The view of FIG. 1N illustrates more fully the overall structure of a gate all around transistor 104. The structures of the transistors 104*a* and 104*b* may be substantially similar to the structure of the transistor 104 shown in FIG. 1N. However, FIG. 1N does not illustrate the presence of the semiconductor layer 115*a* or the layer 113*a/b* of the gate metal. Furthermore, FIG. 1N illustrates only two channels 108. Nevertheless, structures and principles shown in FIG. 1N can be utilized for the transistors 104*a* and 104*b*.

FIG. 1N illustrates dielectric barriers 141 between the semiconductor substrate 102 and the source/drain regions 129. The dielectric barriers 141 can be utilized to electrically isolate the source/drain regions 129 from the semiconductor substrate. The dielectric material for the dielectric barriers 141 may include silicon oxide, silicon nitride, silicon oxynitride (SION), SIOCN, SiCN, fluorine-doped silicate glass (FSG), or a low-K dielectric material, formed by low pressure CVD (LPCVD), plasma-enhanced CVD or flowable CVD. Other materials and structures can be utilized for the dielectric barriers 141 without departing from the scope of the present disclosure.

The integrated circuit 100 includes source/drain regions 129. The source/drain regions 129 includes semiconductor material. The source/drain regions 129 can be grown epitaxially from the channel regions 108. The source/drain regions 129 can be epitaxially grown from the channel regions 108 or from the substrate 102 prior to formation of the channel regions 108. The source/drain regions 129 can be doped with N-type dopants species in the case of N-type transistors. The source/drain regions 129 can be doped with P-type dopant species in the case of P-type transistors.

The channel regions 108 extend between the source/drain regions 129. As described previously, the channel regions 108 correspond to the channel regions of the transistor 104. By applying selected voltages to the gate metal 125 and the source/drain regions 129, current flows through the channel regions 108 between the source/drain regions 129.

FIG. 1N also illustrates inner spacers 139 positioned between the source/drain regions 129 and the gate metal 125. More particularly, the inner spacers 139 are positioned between the high-K gate dielectric layer 112*a* and the source/drain regions 129. The inner spacers 139 can include one or more dielectric materials including silicon nitride, SiON, SiOCN, SiCN, silicon oxide, or other dielectric materials. Other dielectric materials can be utilized for the inner spacers 139 without departing from the scope of the present disclosure.

The view of FIG. 1N illustrates the interfacial dielectric layer 110 in contact with the channel regions 108. The high-K gate dielectric layer 112 is in contact with the interfacial dielectric layer 110. The gate metal 125 is in contact with the high-K gate dielectric layer 112.

The integrated circuit 100 includes an interlevel dielectric layer 133 positioned on the source/drain regions 129. The interlevel dielectric layer 133 can include one or more of silicon oxide, silicon nitride, SICOH, SiOC, or an organic polymer. Other types of dielectric materials can be utilized for the interlevel dielectric layer 133 without departing from the scope of the present disclosure.

The integrated circuit 100 includes silicide regions 131 that have been formed in the source/drain regions 129. The silicide regions 131 can include titanium silicide, cobalt silicide, or other types of silicide. Contact plugs 135 have been formed in the interlevel dielectric layer 133. The contact plugs 135 can include cobalt or another suitable conductive material. The contact plugs 135 can be utilized to apply voltages to the source/drain regions 129 of the transistor 104. The contact plugs 135 can be surrounded by a titanium nitride glue layer.

The gate metal 125 has been deposited in a trench formed in the interlevel dielectric layer 133. The gate metal 125 also surrounds the channel regions 108*a* as shown in FIG. 1I. Sidewall spacers 137 are positioned around the gate metal 125 in the trench in the interlevel dielectric layer 133. The sidewall spacers 137 can include multiple dielectric layers including one or more of silicon nitride, silicon oxide, silicon carbide, or other suitable dielectric materials. The high-K gate dielectric layer 112*a* is also positioned on the sidewalls of the trench between the sidewall spacers 137 and the gate metal 125. Other materials, structures, and features can be included in the gate all around transistor 104, and correspondingly, the gate all around transistors 104*a* and 104*b* without departing from the scope of the present disclosure.

In some embodiments, the process for forming the gate all around transistors 104*a* and 104*b* of FIGS. 1A-1K can include forming an alternating stack of first and second epitaxial semiconductor layers over the substrate 102. The process can include patterning the semiconductor stack to form fins and forming shallow trench isolation regions around the fins. Dummy gate structures, including polysilicon material, can then be formed across the fins. Gate spacers 137 can then be formed on sidewalls of the dummy gate structures. The fins can be patterned to form recesses for source/drain regions 129. The first epitaxial layers can then be recessed deformed notches in which the inner spacers 139 are formed. Source/drain regions 129 are then formed. An interlevel dielectric layer 133 can then be formed. The dummy gate structure and the first epitaxial layers are then removed to define channel regions 108*a/b* from the second epitaxial layers. The interlevel dielectric layer 110*a/b* and the high-K gate dielectric layer 112*a/b* are then deposited on the channel regions 108*a/b*. The process described in relation to FIGS. 1A-1N can be performed.

FIGS. 2A-2I are cross-sectional views of an integrated circuit 100 at various stages of processing, in accordance with some embodiments. The process shown and described in relation to FIGS. 2A-2I may utilize similar layers, techniques, and processes as described in relation to FIGS. 1A-1N.

Figures 2A, 2B:
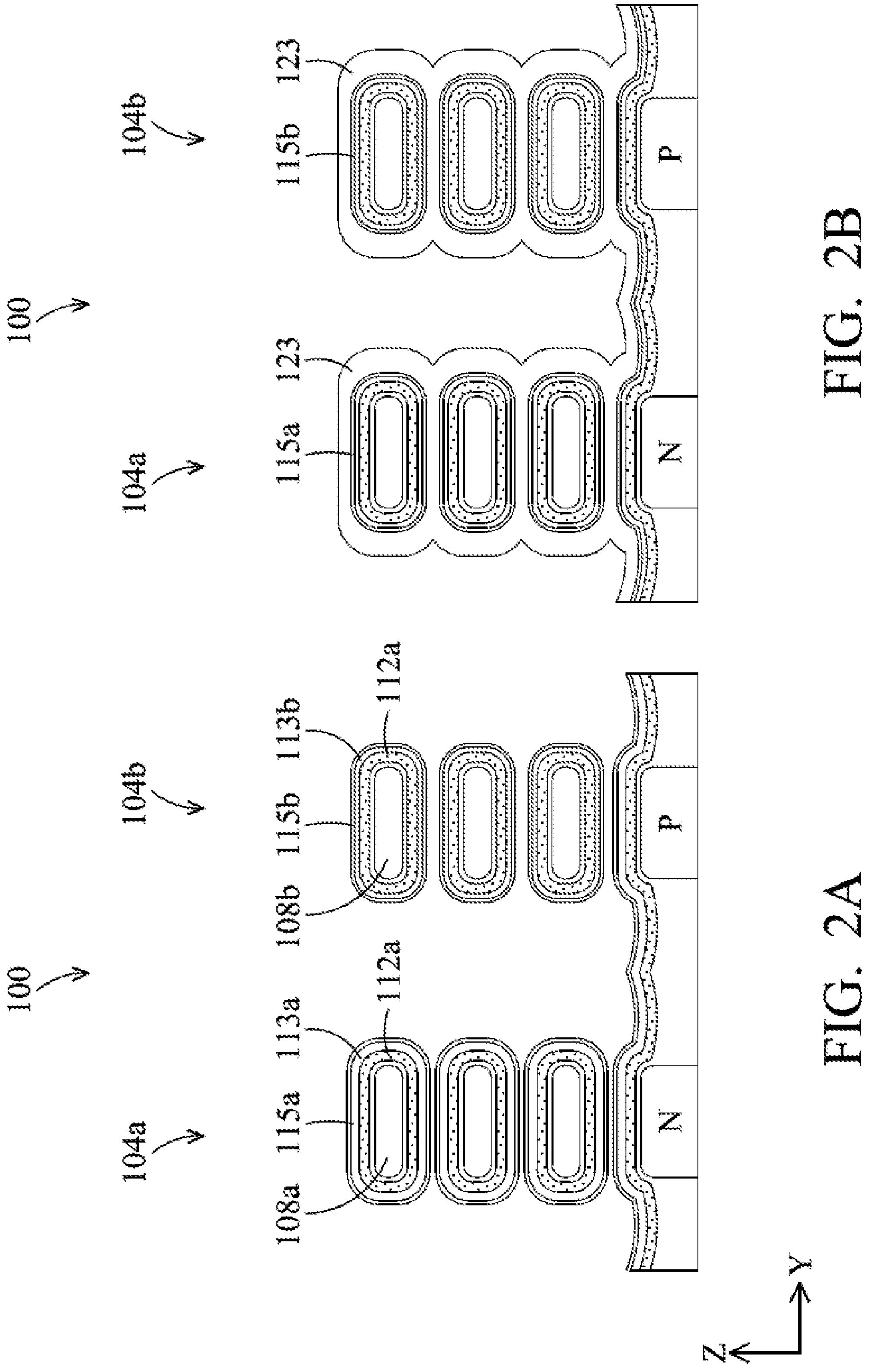

In FIG. 2A, the integrated circuit 100 is at a similar stage of processing as described in relation to FIG. 1A. In FIG. 2B, the semiconductor cap layer 123 has been formed as described in relation to FIG. 1F except that the semiconductor layer 115*b* is present in FIG. 2B during deposition of the semiconductor cap layer 123.

Figures 2C, 2D:
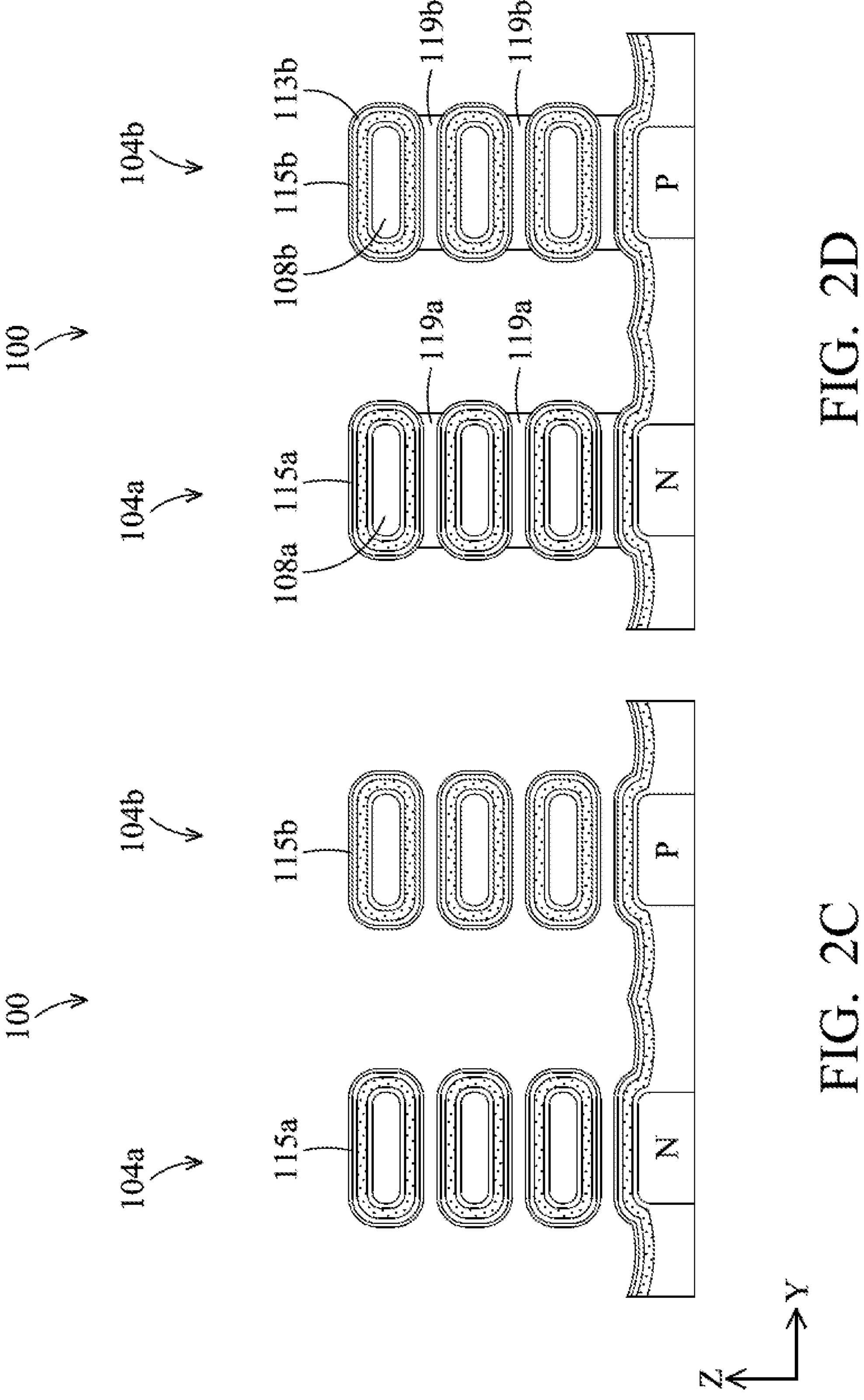

In FIG. 2C, the semiconductor cap layer 123 has been removed as described in relation to FIG. 1G. However, because the semiconductor layer 115*b* is still present (unlike in FIG. 1G), an intermixing layer between the semiconductor layer 115*b* and the layer 113*b* of the gate metal has been formed.

Figures 2E, 2F:
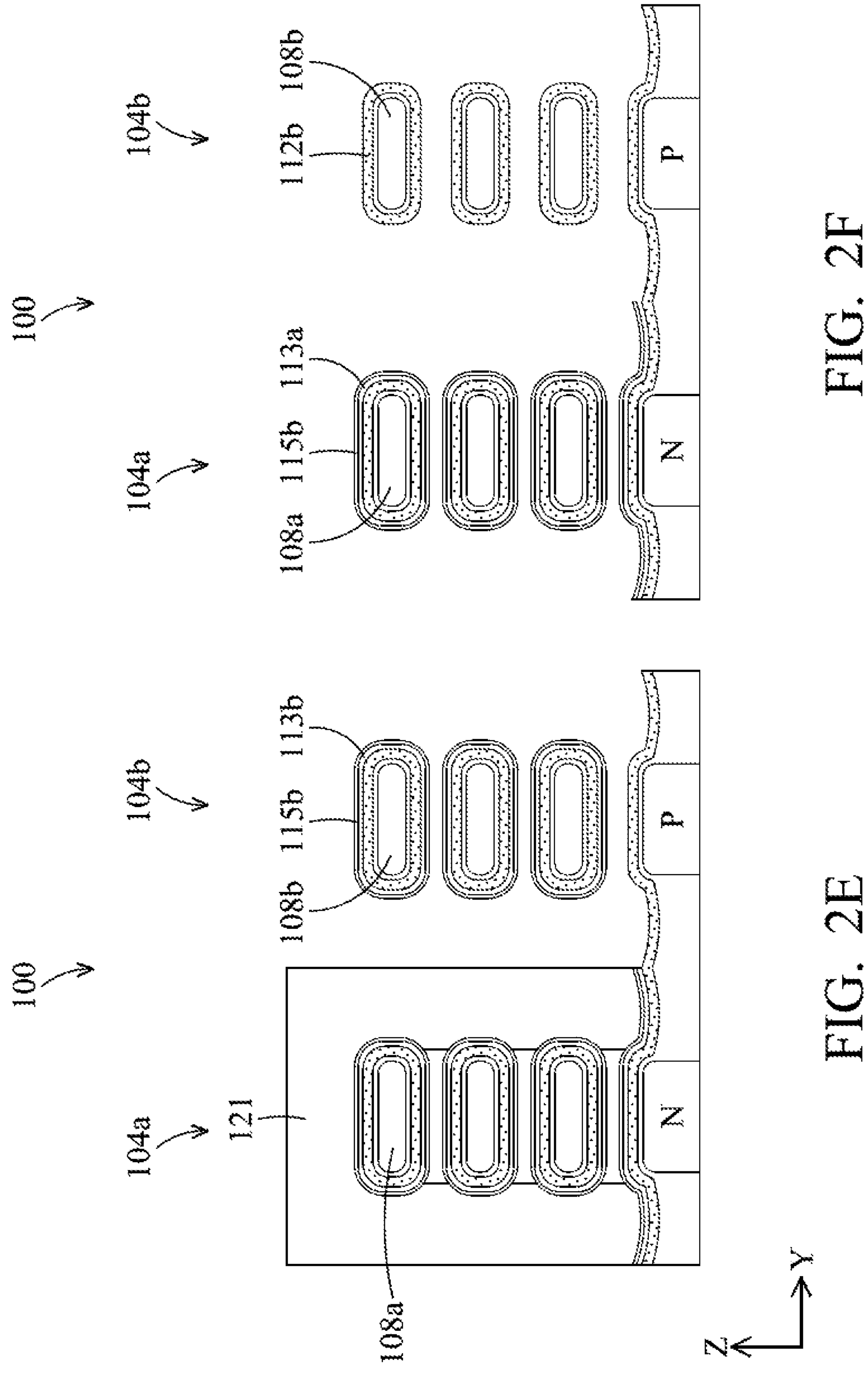

In FIG. 2D, the dielectric plugs 119*a*/119*b* have been formed as described in relation to FIG. 1C. In FIG. 2E, the photoresist 121 has been formed and patterned as described in relation to FIG. 1C. The dielectric plugs 119*b* have been removed as described in relation to FIG. 1D. The semiconductor layer 115*b* has also been removed.

In FIG. 2F, the layer 113*b* of the gate metal has been removed as described in relation to FIG. 1I. The photoresist 121 has also been removed after removal of the layer 113*b* of the gate metal as described in relation to FIG. 1E. The dielectric plugs 119*a* have also been removed as described in relation to FIG. 1E. In FIG. 2G, the gate fill layer 125 of the gate metal has been deposited as described in relation to FIG. 1K.

FIG. 2H is an enlarged view of the integrated circuit 100 of FIG. 2G, in accordance with some embodiments. The channel 108*a* is surrounded by the interfacial gate dielectric layer 110*a*, the high-K gate dielectric 112*a*, the layer 113*a* of the gate metal, the semiconductor layer 115*a*, and the oxide layer 117*a*. The channel 108*b* is surrounded by the interfacial gate dielectric layer 110*b* and the high-K gate dielectric 112*b* and the gate fill layer 125 of the gate metal. The interfacial dielectric layer 110*a* may be thinner than the interfacial gate dielectric layer 110*b*.

Figure 2I:
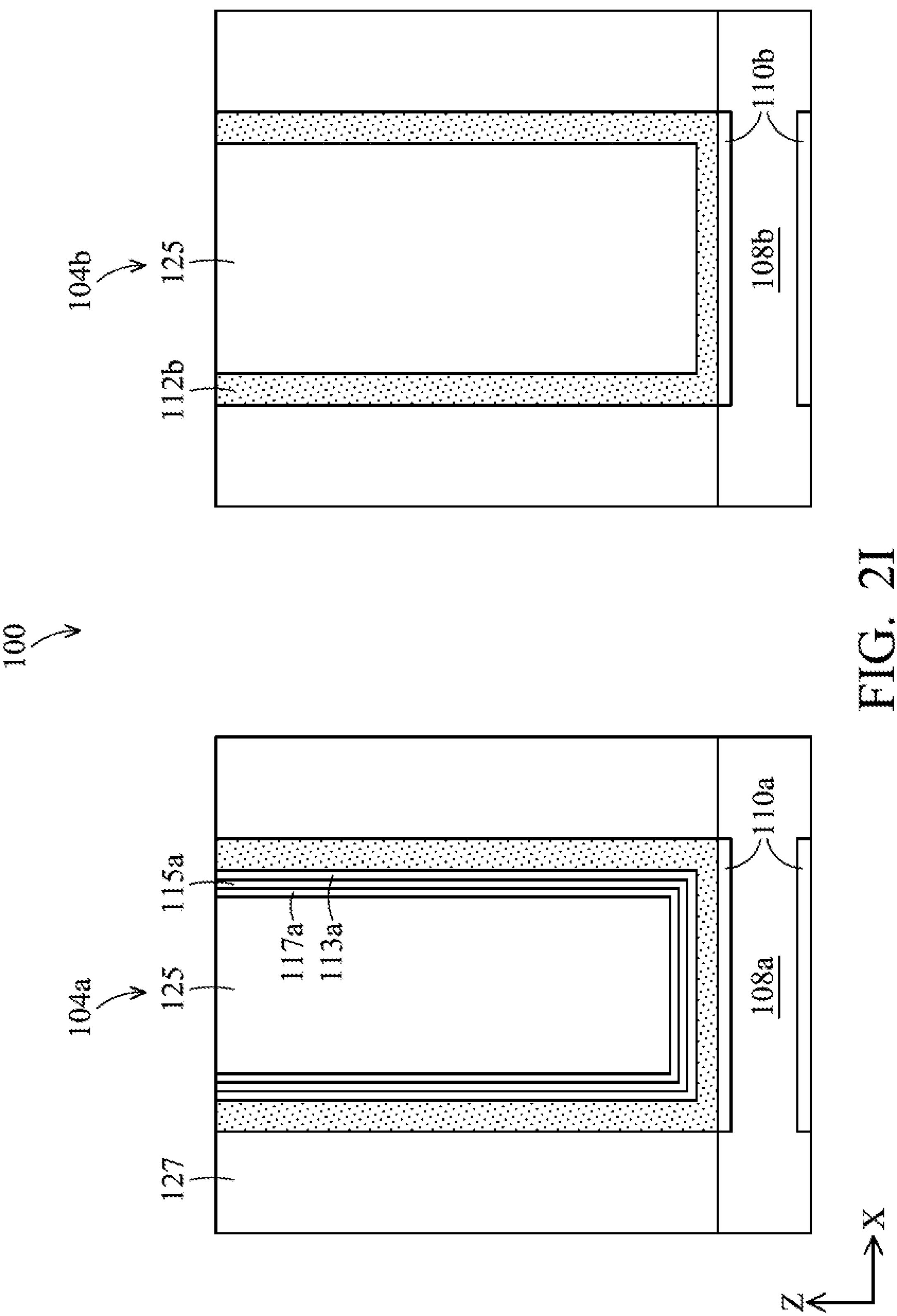

FIG. 2I is a cross-sectional view of a portion of the integrated circuit 100, in accordance with some embodiments. In the view of FIG. 2I, the horizontal direction is the X direction and the vertical direction is the Z direction. FIG. 2I more clearly illustrates the gate structure above the channels 108*a* and 108*b*. In particular, the gate trench above the channels 108*a* includes the high-K gate dielectric layer 112*a*, the layer 113*a* of the gate metal, the semiconductor layer 115*a*, the oxide layer 117*a*, and the gate fill layer 125. The gate trench is bounded by a dielectric layer 127. The gate trench above the channels 108*b* includes the high-K gate dielectric layer 112*b* and the gate fill layer 125. Only a single channel 108*a* and 108*b* is shown for each transistor 104*a* and 104*b*. In practice, the additional stacked channels 108*a*/108*b* are below the channels 108*a* and 108*b* shown in FIG. 2I.

Figure 3:
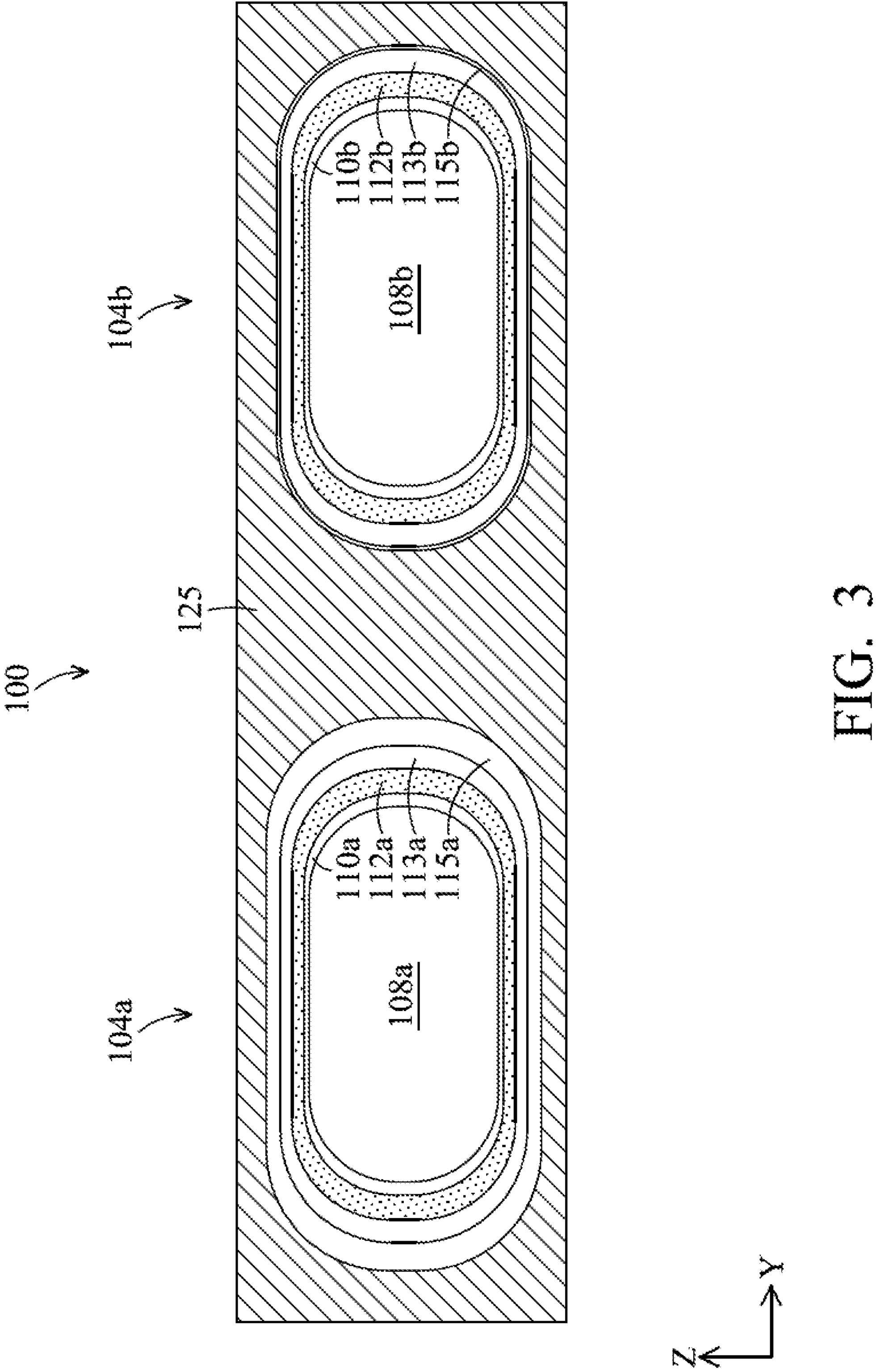
FIG. 3 is a cross-sectional view of an integrated circuit, in accordance with some embodiments.

FIG. 3 is an enlarged cross-sectional view of an integrated circuit 100, in accordance with some embodiments. Integrated circuit 100 of FIG. 3 is substantially similar to the integrated circuit 100 of FIG. 1L, except that the layer 113*b* of the gate metal and the semiconductor layer 115*b* surround the channel 108*b*. At the stage of processing at which the semiconductor layer 115*b* will be removed as described in relation to FIG. 1D, the semiconductor layer 115*b* is not entirely removed but is instead only partially removed. The result is that a portion of the semiconductor layer 115*b* still remains and is thinner than the semiconductor layer 115*a*. This can be accomplished by an atomic layer etching process, a timed etching process or other types of etching processes that can remove a portion of a thin film without removing the entirety of the thin-film. This may be utilized to obtain a desired threshold voltage of the transistor 104*b*. In some embodiments, an intermixing layer is present at the interface between the semiconductor layer 115*b* and the layer 113*b* of the gate metal. In some embodiments, the semiconductor layer 115*b* is entirely consumed as an intermixing layer of the semiconductor layer and the layer 113*b* of the gate metal.

Figure 4:
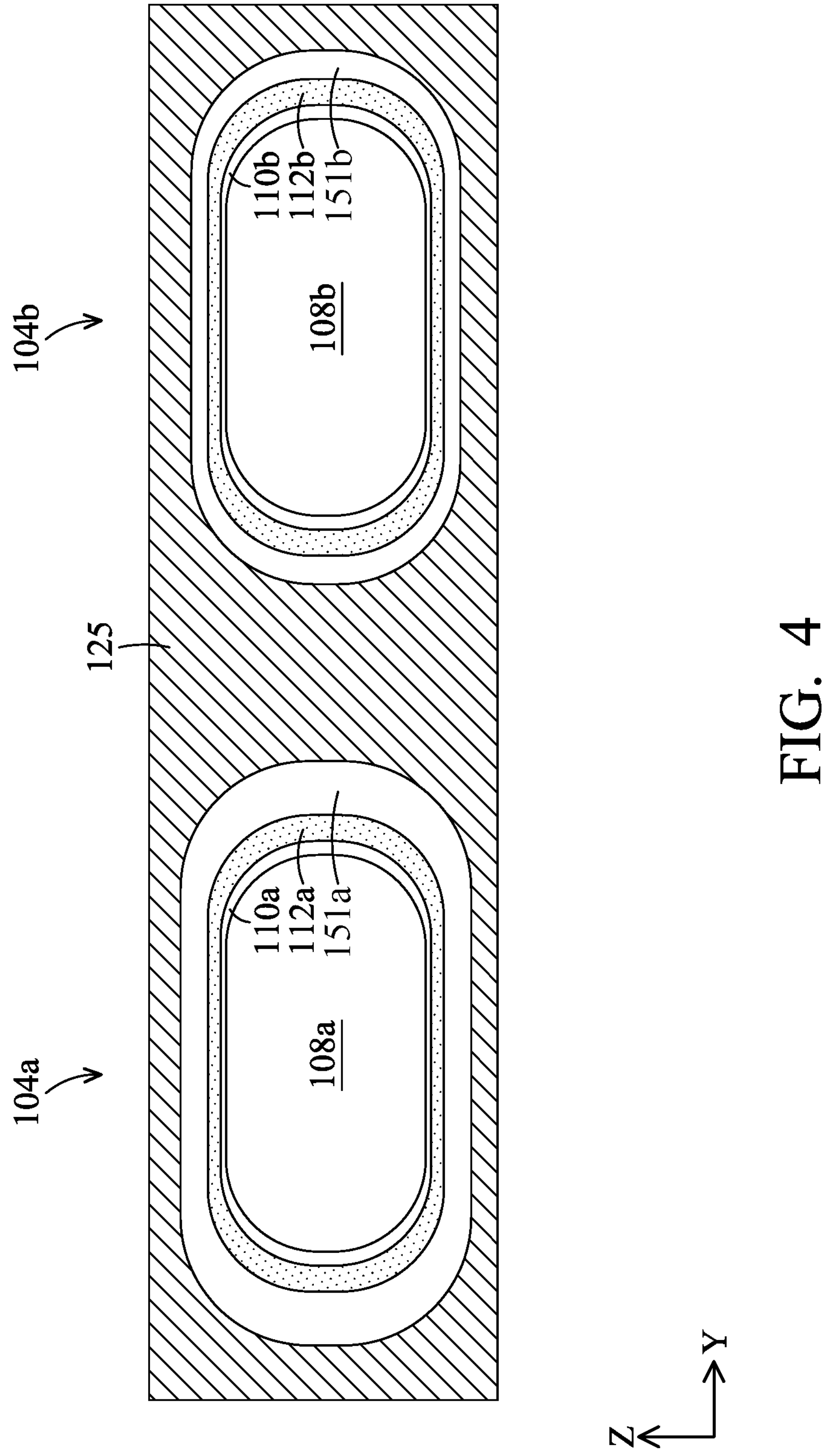
FIG. 4 is a cross-sectional view of an integrated circuit, in accordance with some embodiments.

FIG. 4 is an enlarged cross-sectional view of a channel 108*a* of a transistor 104*a* and the channel 108*b* of a transistor 104*b*. In FIG. 4, the layers 151*a* and 151*b* correspond to intermixing layers of the semiconductor layer 115 and the layer 113 of the gate metal. The semiconductor layers 115*a*/115*b* may be entirely changed to intermixing layers or may partially remain with an intermixing layer between the semiconductor layers 115*a* and 115*b* and the layers 113*a*/113*b* of the gate metal. Furthermore, the total thickness of the intermixing layer 151*b* may be smaller than the total thickness of the intermixing layer 151*a*.

Figures 5A, 5B, 5C:
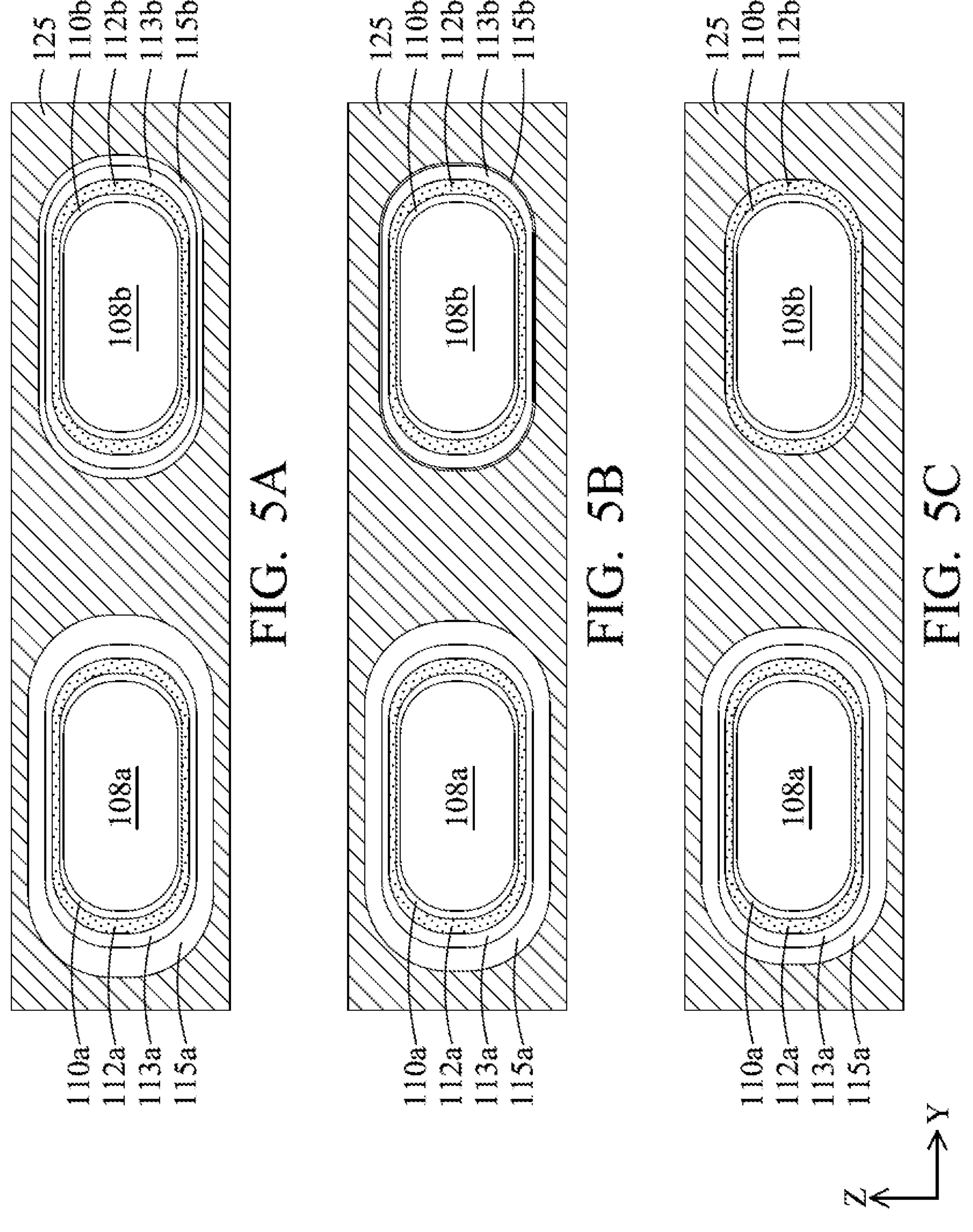
FIGS. 5A-5C are cross-sectional views of an integrated circuit, in accordance with some embodiments.

FIGS. 5A, 5B, and 5C are enlarged cross-sectional views of a channel region 108*a* of the transistor 104*a* and the channel region 108*b* of the transistor 104*b*. FIGS. 5A, 5B, and 5C illustrate how transistors of different threshold voltages can be formed. In FIG. 5A, a relatively thick semiconductor layer 115*a* is present around the transistor 104*a*. This may correspond to an ultralow threshold voltage NMOS transistor. A portion of the semiconductor layer 115*b* is present around the transistor 104*b*. This may correspond to a PMOS transistor of a standard threshold voltage.

In FIG. 5B, the semiconductor layer 115*a* is present in relatively thick. This may correspond to an NMOS transistor having a low threshold voltage. The semiconductor layer 115*b* is also present around the channels 108*b*, though thinner than in FIG. 5A. This may correspond to a PMOS transistor with a low threshold voltage.

In FIG. 5C, the semiconductor layer 115*a* is present around the channels 108*a*, but is thinner than in FIG. 5B. This may correspond to an NMOS transistor with a standard threshold voltage. The semiconductor layer 115*b* is entirely gone at the channel 108*b*. This may correspond to a PMOS transistor with an ultralow threshold voltage. The various transistor structures of FIGS. 5A-5C may be in a same integrated circuit 100 such that the integrated circuit 100 includes three types of NMOS transistor and three types of PMOS transistor.

Figure 6:
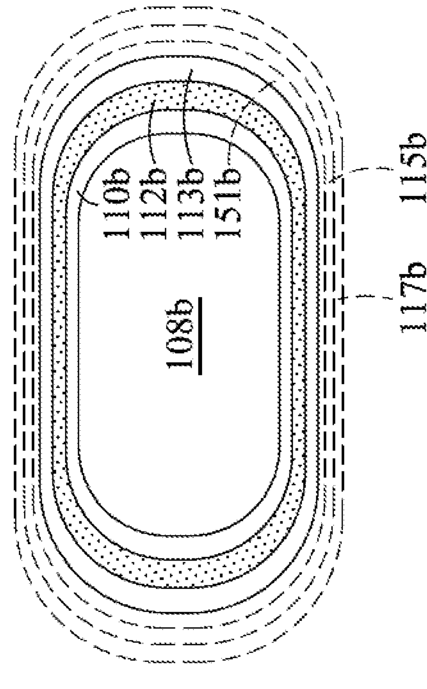
FIG. 6 is a cross-sectional view of an integrated circuit, in accordance with some embodiments.
Figure 6:
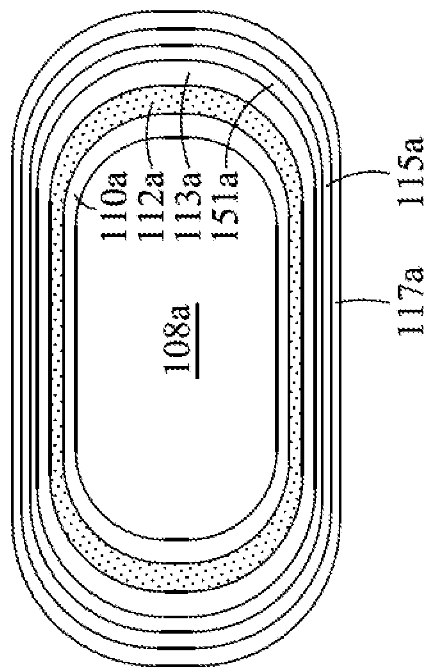

FIG. 6 is an enlarged cross-sectional view of a channel 108*a* of a transistor 104*a* and the channel region 108*b* of a transistor 104*b*. The interfacial gate dielectric layer 110*a*, the high-K gate dielectric layer 112*a*, the layer 113*a* of the gate metal, the intermixing layer 151*a*, the semiconductor layer 115*a*, and the oxide layer 117*a* are present around the channels 108*a* of the transistor 104*a*. The interfacial gate dielectric layer 110*b*, the high-K gate dielectric layer 112*b*, and the layer 113*b* of the gate metal are present around the channels 108*b* of the transistor 104*b*. Dashed lines indicate that the intermixing layer 151*b*, the semiconductor layer 115*b*, and the oxide layer 117*b* have been removed at the transistor 104*b*.

Figure 7:
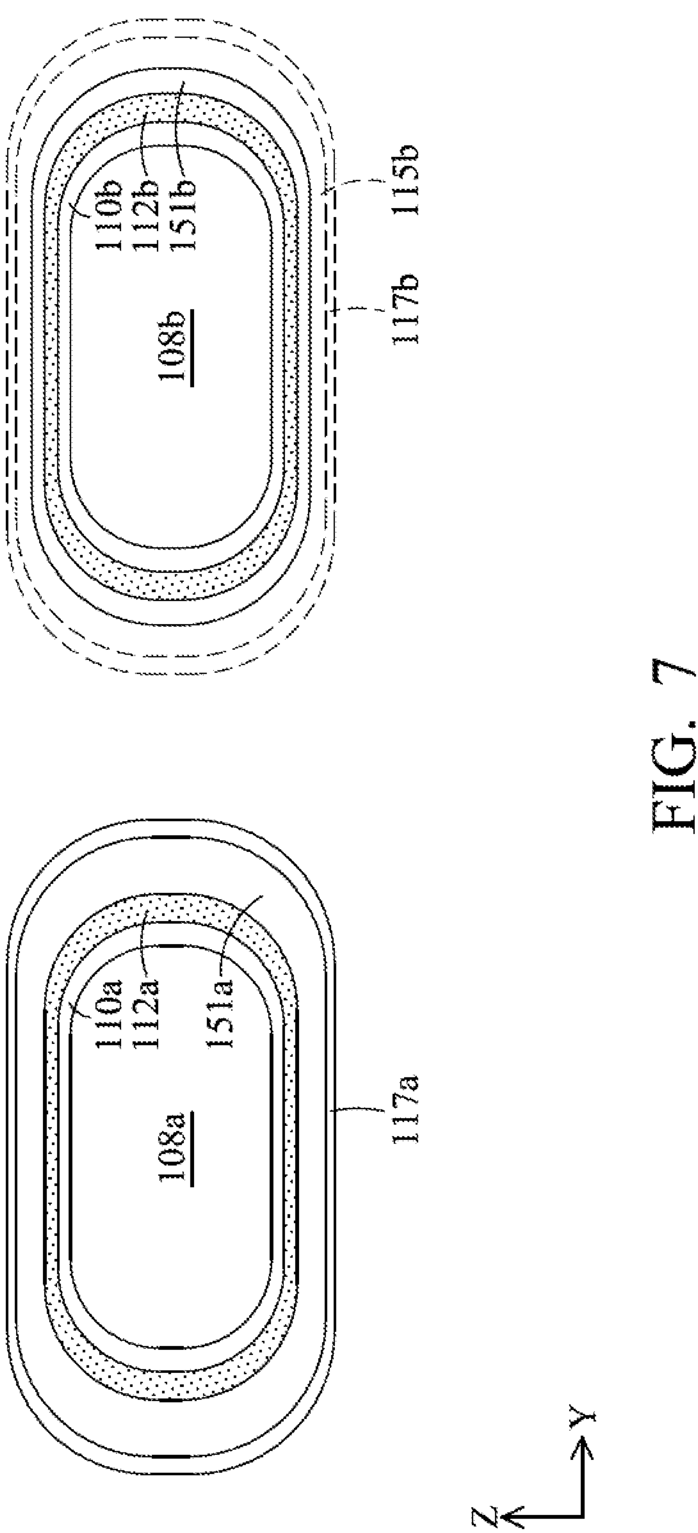
FIG. 7 is a cross-sectional view of an integrated circuit, in accordance with some embodiments.

FIG. 7 is an enlarged cross-sectional view of a channel 108*a* of a transistor 104*a* and the channel 108*b* of a transistor 104*b*. The interfacial gate dielectric layer 110*a*, the high-K gate dielectric layer 112*a*, the intermixing layer 151*a*, the semiconductor layer 115*a*, and the oxide layer 117*a* are present around the channels 108*a* of the transistor 104*a*. The interfacial gate dielectric layer 110*b*, the high-K gate dielectric layer 112*b*, and the intermixing layer 151*b* are present around the channels 108*b* of the transistor 104*b*. Dashed lines indicate that the semiconductor layer 115*b* and the oxide layer 117*b* have been removed at the transistor 104*b*.

Figure 8:
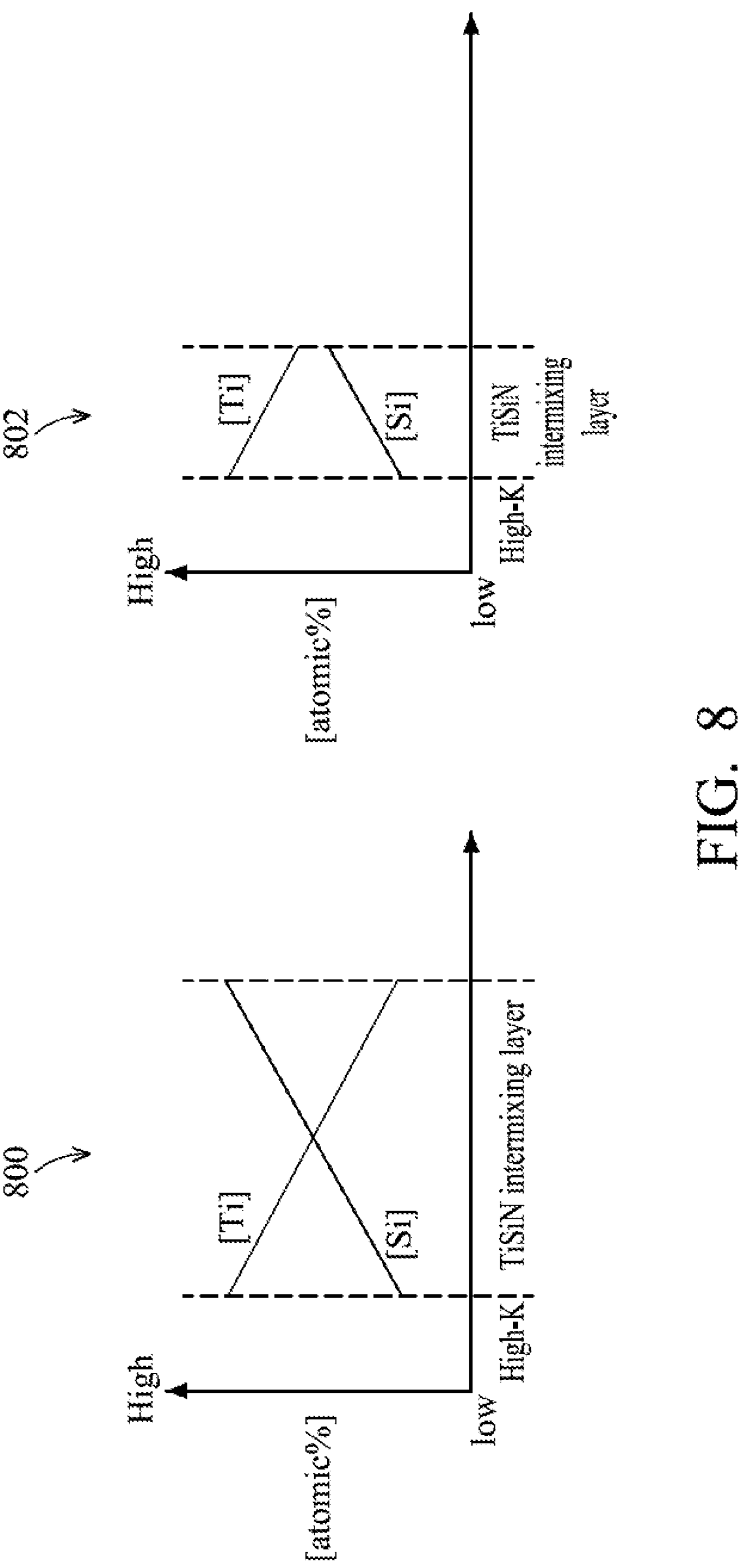
FIG. 8 illustrates graphs associated with intermixing layers of an integrated circuit in accordance with some embodiment.

FIG. 8 includes a graph 800 illustrating the intermixing layer 151*a* of FIG. 7, in accordance with some embodiments. The graph 800 illustrates the percentage of titanium and silicon (in examples in which the gate metal is titanium nitride and the semiconductor layer of silicon) as distance increases away from the channel 108*a*. FIG. 8 illustrates the intermixing layer 151*b* of FIG. 7 in accordance with some embodiments. The graph 802 illustrates the percentage of titanium and silicon as distance increases away from the channel 108*b*. Because the intermixing layer is partially removed, the intermixing layer is thinner and the concentration profile is adjusted accordingly.

Figure 9:
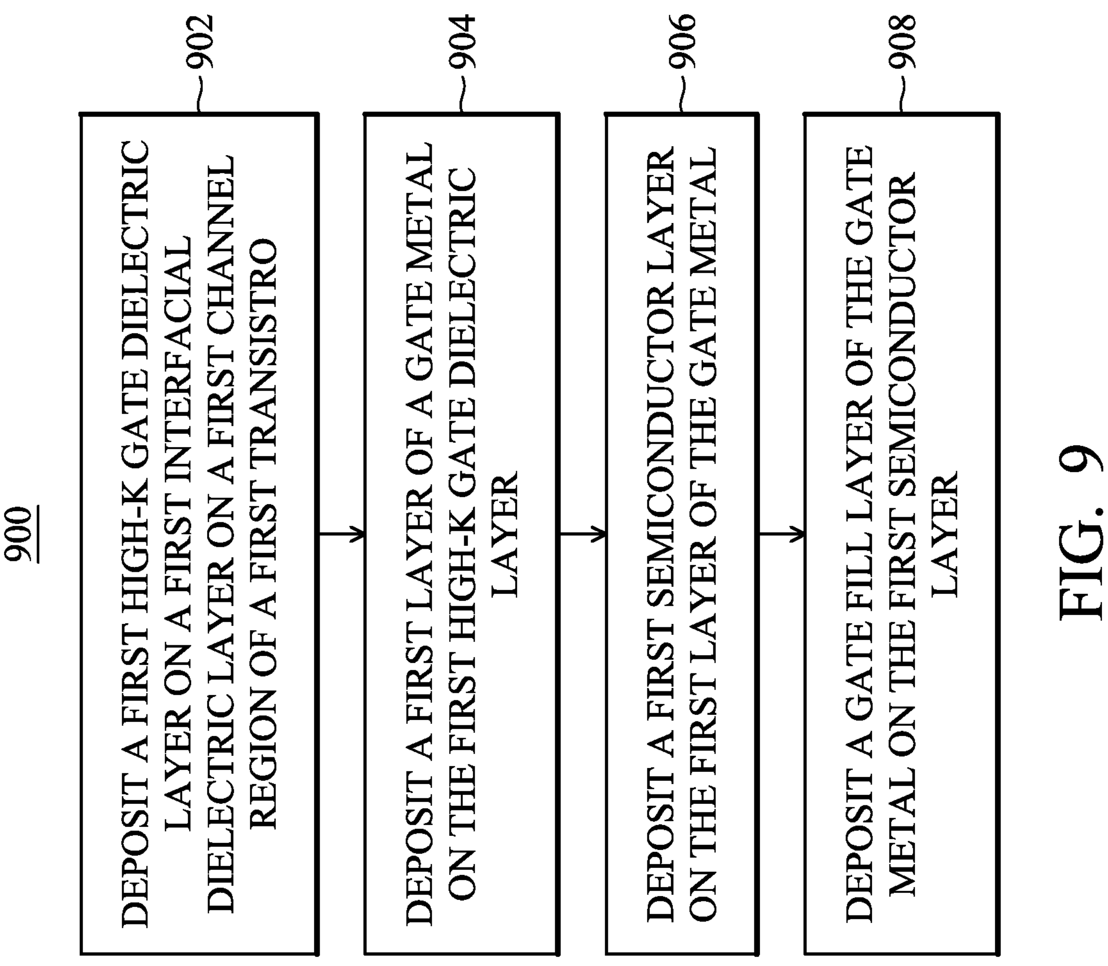
FIG. 9 is a flow diagram of a method for processing an integrated circuit, in accordance with some embodiments.

FIG. 9 is a flow diagram of a method 900 for processing an integrated circuit, in accordance with some embodiments. The method 900 can utilize processes, components, and systems described in relation to FIGS. 1A-8. At 902, the method 900 includes depositing a first high-K gate dielectric layer on a first interfacial gate dielectric layer on a first channel region of a first transistor. One example of a first interfacial gate dielectric layer is the interfacial gate dielectric layer 110*a* of FIG. 1A. One example of a first high-K gate dielectric layer is the high-K gate dielectric layer 112*a* of FIG. 1A. One example of a first channel is the channel 108*a* of FIG. 1A. At 904, the method includes depositing a first layer of a gate metal on the first high-K gate dielectric layer. One example of a first layer of a gate metal is the layer 113*a* of FIG. 1A. At 906, the method 900 includes depositing a first semiconductor layer on the first layer of the gate metal. One example of a first semiconductor layer is the first semiconductor layer 115*a* of FIG. 1A. At 908, the method 900 includes depositing a gate fill layer of the gate metal on the first semiconductor layer. One example of a gate fill layer is the gate fill layer 125 of FIG. 1L.

Figure 10:
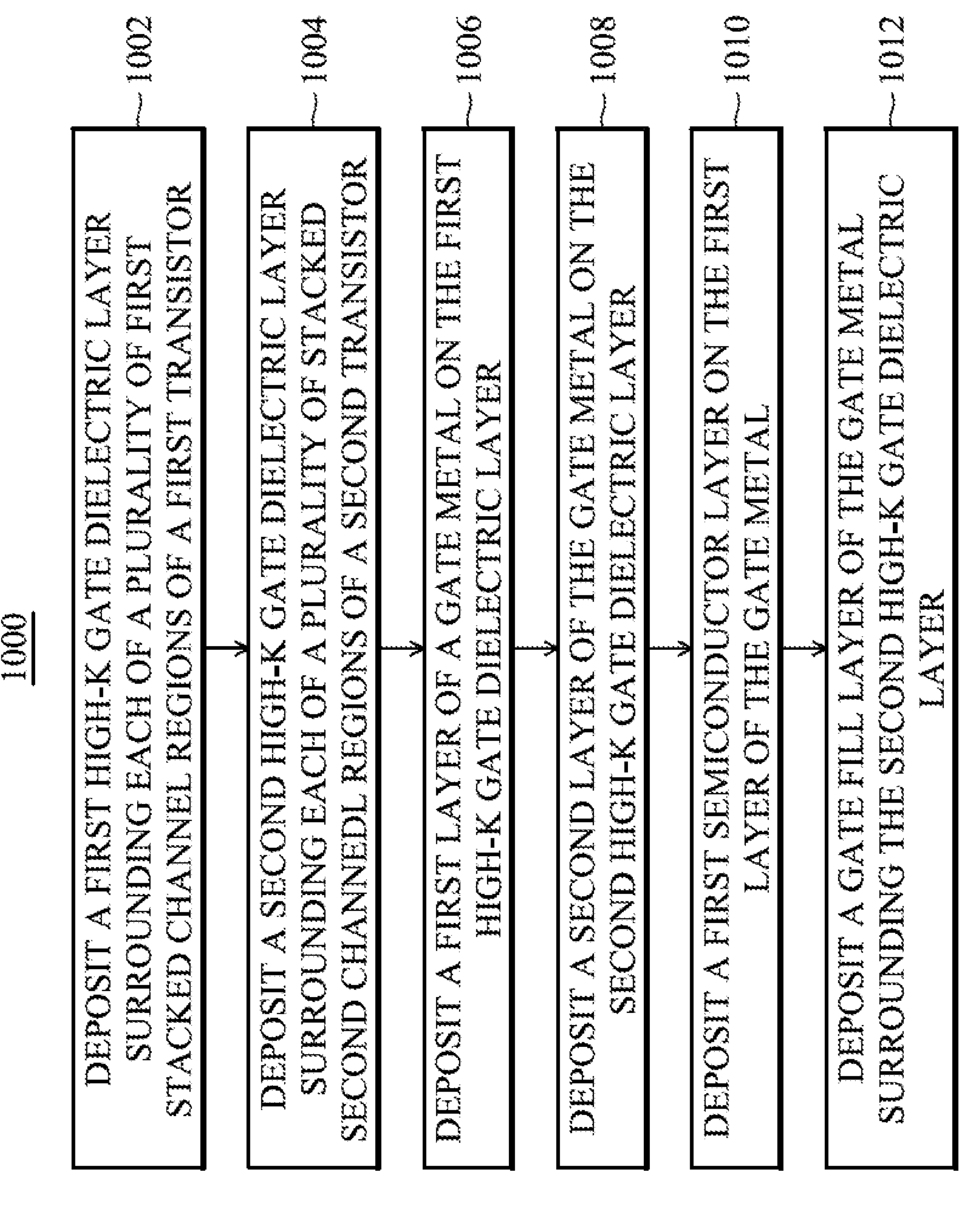
FIG. 10 is a flow diagram of a method for processing an integrated circuit, in accordance with some embodiments.

FIG. 10 is a flow diagram of a method 1000 for processing an integrated circuit, in accordance with some embodiments. The method 1000 can utilize processes, components, and systems described in relation to FIGS. 1A-8. At 1002, the method 1000 includes depositing a first high-K gate dielectric layer surrounding each of a plurality of first stacked channel regions of a first transistor. One example of first stacked channel regions is the channel regions 108*a* of FIG. 1A. One example of a first transistor is the transistor 104*a* of FIG. 1A. One example of a first high-K gate dielectric layer is the high-K gate dielectric layer 112*a* of FIG. 1A. At 1004, the method 1000 includes depositing a second high-K gate dielectric layer surrounding each of a plurality of second stacked channel regions of a second transistor. One example of second stacked channel regions is the channel regions 108*b* of FIG. 1A. One example of a second transistor is the transistor 104*b* of FIG. 1A. One example of a second high-K gate dielectric layer is the high-K gate dielectric layer 112*b* of FIG. 1A. At 1006, the method 1000 includes depositing a first layer of a gate metal on the first high-K gate dielectric layer. One example of a first layer of the gate metal is the first layer 113*a* of FIG. 1A. At 1008, the method 1000 includes depositing a second layer of the gate metal on the second high-K gate dielectric layer. One example of a second layer of the gate metal is the second layer 113*b* of FIG. 1A. At 1010, the method 1000 includes depositing a first semiconductor layer on the first layer of the gate metal. One example of a first semiconductor layer is the first semiconductor layer 115*a* of FIG. 1A. At 1012, the method 1000 includes depositing a gate fill layer of the gate metal surrounding the second high-K gate dielectric layer. One example of a gate fill layer is the gate fill layer 125 of FIG. 1L.

Embodiments of the present disclosure provide an integrated circuit with simplified gate electrode structures for both NMOS and PMOS transistors. In particular, a single gate metal may be used for both NMOS and PMOS transistors. An effective work function layer can be formed for NMOS transistors by depositing a thin layer of the gate metal followed by deposition of a semiconductor material, such as silicon or other suitable materials. The semiconductor layer is removed at the PMOS transistors. The gate metal is then deposited on both the NMOS and the PMOS regions. The semiconductor layer combined with the initial thin deposition of the gate metal results in an effective work function for the NMOS transistors. At the PMOS transistors, the gate electrode may include a single gate metal in contact with the gate dielectric layers. The result is that the gate resistance of the NMOS transistors is improved by utilizing the semiconductor plus thin gate metal as a work function layer. Furthermore, the transistor can be scaled down and the cell height can be reduced due to the single gate metal utilized for both the NMOS and PMOS transistors. The physical gate metal boundary is the same as the actual gate metal boundary due to the lack of diffusion. This leads to properly functioning integrated circuits, higher wafer yields, and better functioning electronic devices.

In some embodiments, a method includes depositing a first high-K gate dielectric layer on a first interfacial gate dielectric layer on a first channel region of a first transistor and depositing a first layer of a gate metal on the first high-K gate dielectric layer. The method includes depositing a first semiconductor layer on the first layer of the gate metal and depositing a gate fill layer of the gate metal on the first semiconductor layer.

In some embodiments, a method includes depositing a first high-K gate dielectric layer surrounding each of a plurality of first stacked channel regions of a first transistor, depositing a second high-K gate dielectric layer surrounding each of a plurality of stacked second channel regions of a second transistor, and depositing a first layer of a gate metal on the first high-K gate dielectric layer. The method includes depositing a second layer of the gate metal on the second high-K gate dielectric layer, depositing a first semiconductor layer on the first layer of the gate metal, and depositing a gate fill layer of the gate metal surrounding the second high-K gate dielectric layer.

In some embodiments, an integrated circuit includes a first transistor. The first transistor includes a plurality of stacked first channel regions, a first interfacial gate dielectric layer surrounding each of the first channel regions, and a first high-K gate dielectric layer on the first interfacial dielectric layer. The first transistor includes a first layer of a gate metal on the first high-K gate dielectric layer, a semiconductor layer on the first layer of the gate metal, and a first gate fill layer of the gate metal on the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

depositing a first high-K gate dielectric layer on a first interfacial gate dielectric layer on a first channel region of a first transistor;

depositing a first layer of a gate metal on the first high-K gate dielectric layer;

depositing a first semiconductor layer on the first layer of the gate metal; and depositing a gate fill layer of the gate metal on the first semiconductor layer;

depositing a second high-K gate dielectric layer on a second interfacial gate dielectric layer on a second channel region of a second transistor;

depositing a second layer of the gate metal on the second high-K gate dielectric layer;

depositing a second semiconductor layer on the second layer of the gate metal; and removing the second semiconductor layer from the second layer of the gate metal; and depositing the gate fill layer of the gate metal on the second layer of the gate metal surrounding the second high-K gate dielectric layer.

2. The method of claim 1, further comprising:

removing the second layer of the gate metal prior to depositing the gate fill layer; and depositing the gate fill layer on the second high-K gate dielectric layer.

3. The method of claim 1, further comprising:

depositing the first and second layer of the gate metals in a same deposition process; and depositing the first and second semiconductor layers in a same deposition process.

4. The method of claim 1, further comprising depositing an oxide layer on the first semiconductor layer prior to depositing the gate fill layer.

5. The method of claim 1, wherein the first and second transistors are gate all around transistors.

6. The method of claim 1, comprising forming an intermixing layer of the first semiconductor layer and the first layer of the gate metal as an interface between the first semiconductor layer and the first layer of the gate metal.

7. The method of claim 1, wherein the first transistor is an NMOS transistor and the first semiconductor layer adjusts an effective work function of the first transistor.

8. The method of claim 1, further comprising:

forming a semiconductor cap layer on the first semiconductor layer and the second semiconductor layer prior to depositing the gate fill layer; and performing a thermal annealing process;

removing the semiconductor cap layer after performing the thermal annealing process; and depositing the gate fill layer after removing the semiconductor cap layer.

9. The method of claim 1, wherein the first interfacial gate dielectric layer is thinner than the second interfacial gate dielectric layer.

10. A method, comprising:

depositing a first high-K gate dielectric layer surrounding each of a plurality of first stacked channel regions of a first transistor;

depositing a second high-K gate dielectric layer surrounding each of a plurality of second stacked channel regions of a second transistor;

depositing a first layer of a gate metal on the first high-K gate dielectric layer;

depositing a second layer of the gate metal on the second high-K gate dielectric layer;

depositing a first semiconductor layer on the first layer of the gate metal; and depositing a gate fill layer of the gate metal surrounding the second high-K gate dielectric layer;

depositing a second semiconductor layer on the second layer of the gate metal in a same deposition process as the first semiconductor layer;

depositing a first dielectric plug between two of the first stacked channel regions and in contact with the first semiconductor layer;

removing the second semiconductor layer while the first dielectric plug is present between the two first stacked channel regions; and depositing the gate fill layer after removing the second semiconductor layer.

11. The method of claim 10, further comprising performing a first thermal annealing process after removing the second semiconductor layer.

12. The method of claim 11, further comprising:

depositing a semiconductor cap layer on the first semiconductor layer and the second layer of the gate metal after removing the second semiconductor layer;

performing a second thermal annealing process in the presence of the semiconductor cap layer.

13. An integrated circuit, comprising:

a first transistor including:

a plurality of stacked first channel regions;

a first interfacial gate dielectric layer surrounding each of the first channel regions;

a first high-K gate dielectric layer on the first interfacial gate dielectric layer;

a first layer of a gate metal on the first high-K gate dielectric layer;

a semiconductor layer on the first layer of the gate metal; and a first gate fill layer of the gate metal on the semiconductor layer;

a second transistor including:

a plurality of stacked second channel regions;

a second interfacial gate dielectric layer surrounding each of the second channel regions;

a second high-K gate dielectric layer surrounding on the second interfacial gate dielectric layer;

a second layer of the gate metal of a same material as the first layer of the gate metal on the second high-K gate dielectric layer;

a second gate fill layer of a same material as the first gate fill layer of the gate metal on the semiconductor layer.

14. The integrated circuit of claim 13, wherein the first interfacial gate dielectric layer is thinner than the second interfacial gate dielectric layer.

15. The integrated circuit of claim 13, comprising an intermixing layer of the semiconductor layer and the first layer of the gate metal between the semiconductor layer and the first layer of the gate metal.

16. The integrated circuit of claim 13, wherein the second gate fill layer and the first gate fill layer share a boundary within 5 nanometers of a midpoint between the first transistor and the second transistor.

17. The integrated circuit of claim 13, wherein the second transistor includes a second semiconductor layer between the second layer of the gate metal and the second gate fill layer.

18. The integrated circuit of claim 17, wherein the second transistor includes an intermixing layer of the second semiconductor layer and the second layer of the gate metal.

19. The integrated circuit of claim 18, wherein the intermixing layer includes TiSiN.

20. The integrated circuit of claim 13, wherein the first semiconductor layer is thicker than the second semiconductor layer.

* * * * *